United States Patent
Mori et al.

(10) Patent No.: US 8,111,575 B2
(45) Date of Patent: Feb. 7, 2012

(54) SEMICONDUCTOR DEVICE

(75) Inventors: Kaoru Mori, Kawasaki (JP); Shinya Fujioka, Kawasaki (JP); Yoshitaka Takahashi, Kawasaki (JP); Jun Ohno, Kawasaki (JP); Akihiro Funyu, Kawasaki (JP); Shinichiro Suzuki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 224 days.

(21) Appl. No.: 12/684,652

(22) Filed: Jan. 8, 2010

(65) Prior Publication Data

US 2010/0110818 A1    May 6, 2010

Related U.S. Application Data

(63) Continuation of application No. PCT/JP2007/063880, filed on Jul. 12, 2007.

(51) Int. Cl.
*G11C 5/14* (2006.01)

(52) U.S. Cl. ........ 365/222; 365/211; 365/227; 365/229; 713/320

(58) Field of Classification Search .................... 365/211
See application file for complete search history.

(56) References Cited

U.S. PATENT DOCUMENTS

| | | | |
|---|---|---|---|
| 5,659,517 A | 8/1997 | Arimoto et al. | |
| 6,028,805 A | 2/2000 | Higuchi | |
| 6,556,496 B2 * | 4/2003 | Benedix et al. | 365/222 |
| 6,667,925 B2 * | 12/2003 | Kobayashi et al. | 365/211 |
| 6,836,179 B2 | 12/2004 | Mizuno et al. | |
| 6,934,210 B2 | 8/2005 | Akiba et al. | |
| 7,248,526 B2 | 7/2007 | Ito et al. | |
| 7,276,956 B2 | 10/2007 | Furuta et al. | |
| 7,630,267 B2 * | 12/2009 | Chen | 365/211 |
| 7,782,698 B2 * | 8/2010 | Kim | 365/222 |
| 2003/0043680 A1 | 3/2003 | Akiba et al. | |
| 2003/0102904 A1 | 6/2003 | Mizuno et al. | |
| 2005/0285662 A1 | 12/2005 | Furuta et al. | |
| 2006/0023545 A1 | 2/2006 | Ito et al. | |

FOREIGN PATENT DOCUMENTS

| | | |
|---|---|---|
| JP | 04-319598 A | 11/1992 |
| JP | 08-83487 A | 3/1996 |
| JP | 2000-021162 A | 1/2000 |
| JP | 2003-068079 A | 3/2003 |
| JP | 2003-168735 A | 6/2003 |
| JP | 2006-012968 A | 1/2006 |
| JP | 2006-031860 A | 2/2006 |

* cited by examiner

*Primary Examiner* — Tan T. Nguyen
(74) *Attorney, Agent, or Firm* — Arent Fox LLP

(57) ABSTRACT

There is provided a semiconductor device including: a temperature sensor detecting temperature; an inner circuit operating when supplied with a power supply voltage from a power supply line; a switch connected between the power supply line and the inner circuit; and a control circuit performing control in which, in a case where the temperature detected by the temperature sensor is higher than a threshold value, the switch is turned on when the inner circuit is in operation and the switch is turned off when the inner circuit is in non-operation, and in a case where the temperature detected by the temperature sensor is lower than the threshold value, the switch is turned on when the inner circuit is in operation and in non-operation.

20 Claims, 23 Drawing Sheets

F I G. 5
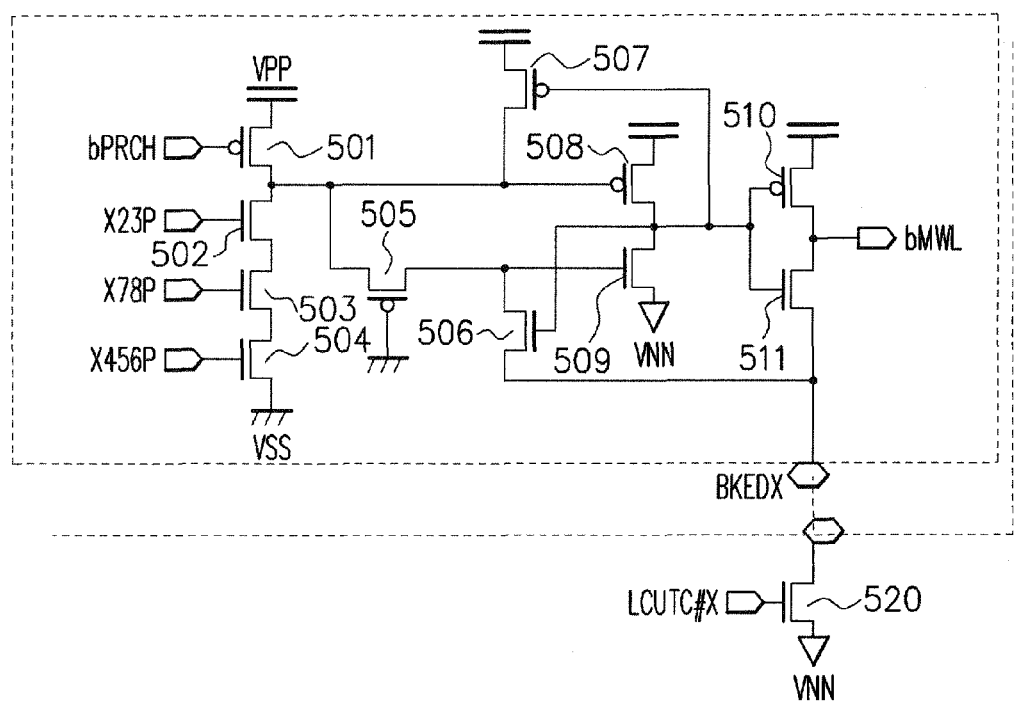

F I G. 7
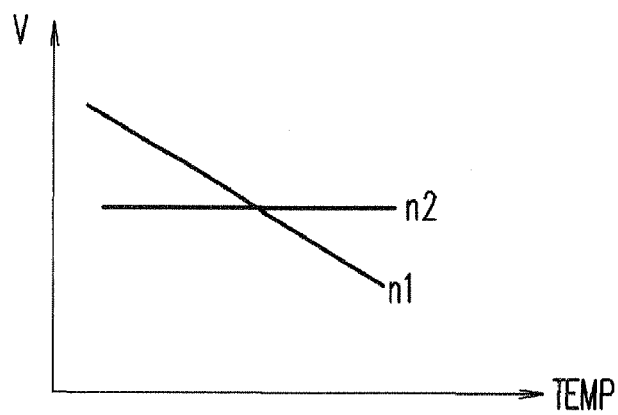
F I G. 8
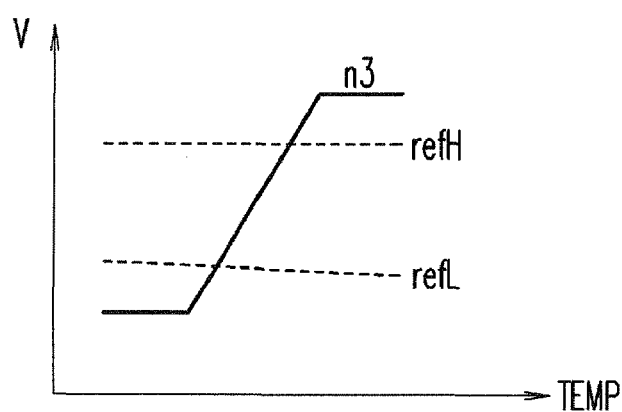

F I G. 10
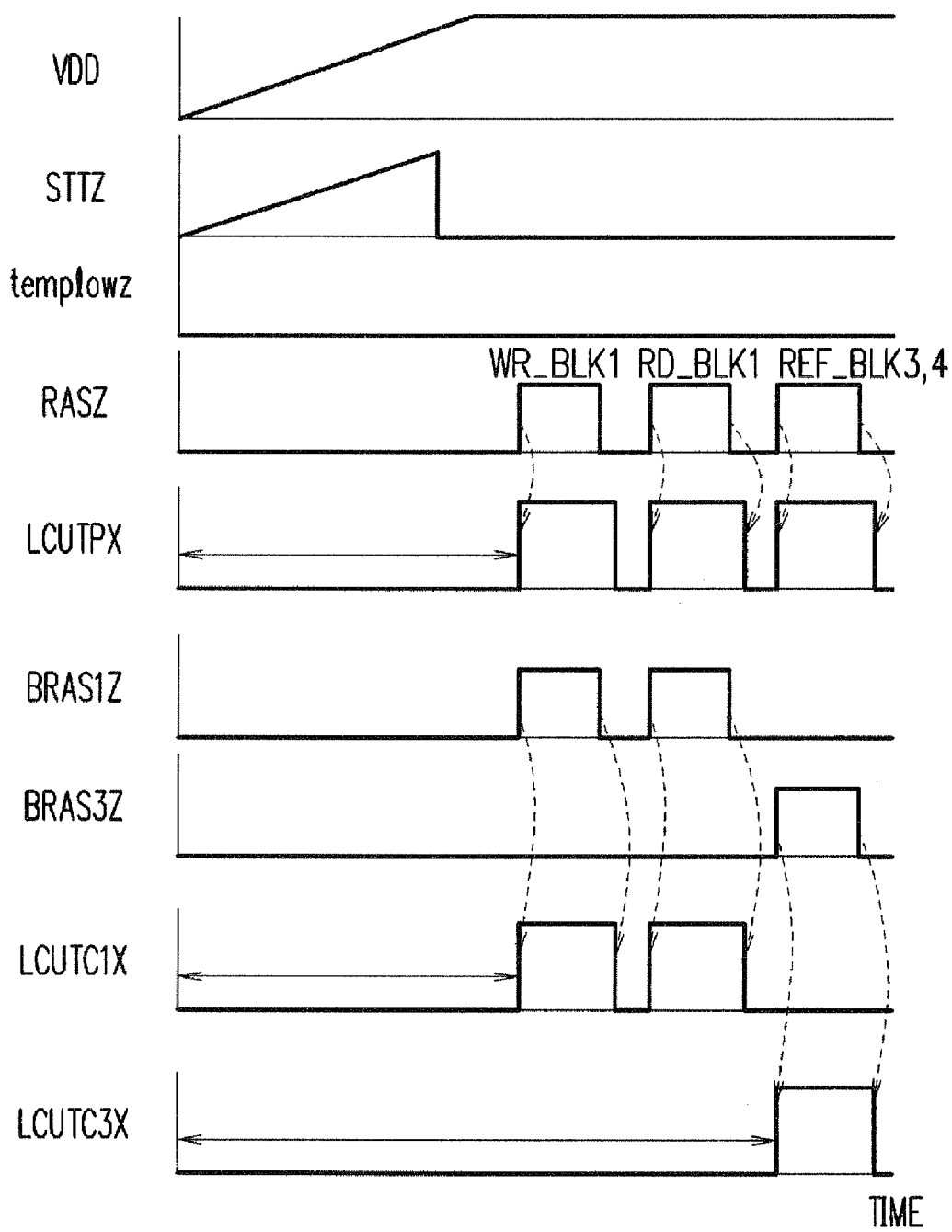

SEMICONDUCTOR DEVICE

CROSS-REFERENCE TO RELATED APPLICATIONS

This application is a Continuation of International Application No. PCT/JP2007/063880, with an international filing date of Jul. 12, 2007, which designating the United States of America, the entire contents of which are incorporated herein by reference.

FIELD

The present embodiments relate to a semiconductor device.

BACKGROUND

FIG. 21 is a circuit diagram of a semiconductor device. A delay circuit 401 delays a signal PX1 to output a signal MZ1. A delay circuit 402 delays a signal PX2 to output a signal MZ2. A delay circuit 403 delays a signal PX3 to output a signal MZ3. A gate of a p-channel field effect transistor 421 receives a signal LCUTX via an inverter 423. A gate of an n-channel field effect transistor 422 receives the signal LCUTX via the inverter 423 and an inverter 424.

To reduce power consumption of the semiconductor device, the transistors 421 and 422 for leakage cut are inserted between source terminals of the delay circuits 401 to 403 and a power supply line, and in a standby period, the transistors 421 and 422 are turned off, which enables a reduction in a leakage current in the standby period.

FIG. 22 is a graph illustrating a refresh period vs. temperature. A horizontal axis represents temperature [° C.] and a vertical axis represents time. To reduce a standby current at room temperatures or lower, a temperature sensor is mounted on a DRAM, and a refresh period TR is changed depending on temperature. The refresh period TR of the DRAM is changed in two stages according to whether the temperature is higher than 60° C. or the temperature is 60° C. or lower. A data retention time tREF of memory cells of the DRAM generally has a temperature characteristic that it becomes longer as the temperature gets lower and its rate of increase is saturated at a certain temperature or lower. In accordance with such a temperature characteristic of the data retention time tREF, when the temperature becomes a determination temperature set in the temperature sensor or lower, the self-refresh period TR is increased, which enables a reduction in a refresh current at room temperatures or lower.

In the semiconductor device in FIG. 21, the leakage current in the standby period can be reduced, but an AC (alternating) current increases due to the control for changing ON/OFF of the transistors 421 and 422 for leakage cut depending on whether a current state in the standby period is a refresh operation period or the refresh non-operation period (hereinafter, referred to as leakage cut control).

FIG. 23 is a chart illustrating temperature characteristics of standby currents. Here, the leakage current and the AC current when the control in FIG. 21 and the control in FIG. 22 are both performed are illustrated. A horizontal axis represents temperature [° C.] and a vertical axis represents current. A leakage current 1104 represents the leakage current in the standby period when the leakage cut control is not performed and thus the transistors 421 and 422 are constantly kept on (hereinafter, referred to as an off leakage current). A current 1103 is a current equal to the sum of a leakage current 1101 and an AC current 1102 and represents a current in the standby period when the leakage cut control is performed. The leakage current 1101 is a leakage current in the standby period when the leakage cut control is performed. The AC current 1102 is an AC current of the transistors 421 and 422 for leakage cut control. At temperatures of 60° C. or lower, since the refresh period TR is long, the AC current 1102 is small, and at temperatures higher than 60° C., since the refresh period TR is short, the AC current 1102 becomes large.

A case is given where, when the temperature sensor determines that the temperature is 60° C. or lower, the refresh period TR is twice as long and the AC current 1102 is reduced to ½ compared with those when the temperature is higher than 60° C. Generally, the off leakage current 1104 changes exponentially with temperature. At a high temperature of about 85° C., since the AC current 1102 ascribable to the leakage cut control is smaller than the off leakage current 1104, performing the leakage cut control enables the total standby current 1103 to be smaller than the off leakage current 1104 by a current difference 1105. However, at room temperature of about 40° C. or lower, compared with the case when the temperature is higher than 60° C., the off leakage current 1104 reduces at a rate of a digit according to an exponential function, while the AC current 1102 reduces only to about ½, and therefore, the AC current 1102 becomes larger than the off leakage current 1104 by a current difference 1106, resulting in an increase in the total standby current 1103. Therefore, there is a problem that it is not possible to reduce the standby current 1103 at room temperatures or lower.

Further, a patent document 1 below describes a semiconductor memory circuit including: an inner circuit to which an operating voltage can be selectively supplied or stopped via a switch and which includes a memory array; and an input circuit receiving a predetermined control signal to control the supply and stop of the operating voltage by the switch.

Further, a patent document 2 below descries a semiconductor memory device in which a power supply voltage of memory cells is made lower than a power supply voltage of a peripheral circuit.

Further, a patent document 3 below describes a semiconductor integrated circuit device which includes a MOSFET and a source potential control circuit controlling a source potential of the MOSFET according to an operation mode of the MOSFET, the source potential control circuit changing the source potential that it controls, based on temperature.

Patent document 1: Japanese Laid-open Patent Publication No. 2003-68079
Patent document 2: Japanese Laid-open Patent Publication No. 04-319598
Patent document 3: Japanese Laid-open Patent Publication No. 2006-12968

SUMMARY

It is an object of the present embodiments to provide a semiconductor device whose standby current can be reduced both at high temperatures and at room temperatures.

According to one aspect of the present embodiments, there is provided a semiconductor device including: a temperature sensor detecting temperature; an inner circuit operating when supplied with a power supply voltage from a power supply line; a switch connected between the power supply line and the inner circuit; and a control circuit performing control in which, in a case where the temperature detected by the temperature sensor is higher than a threshold value, the switch is turned on when the inner circuit is in operation and the switch is turned off when the inner circuit is in non-operation, and in a case where the temperature detected by the temperature sensor is lower than the threshold value, the switch is turned on when the inner circuit is in operation and in non-operation.

Additional objects and advantages of the embodiment will be set forth in part in the description which follows, and in part will be obvious from the description, or may be learned by practice of the invention.

The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF DRAWINGS

FIG. 5 is a circuit diagram illustrating a configuration example of part of the inside of a memory cell block;

FIG. 7 is a graph illustrating temperature characteristics of node voltages n1 and n2 in FIG. 6;

FIG. 8 is a graph illustrating a temperature characteristic of a node voltage n3 in FIG. 6;

FIG. 10 is a timing chart for explaining the operation of the leakage cut control circuit in the first mode at a temperature higher than 60° C.;

DESCRIPTION OF EMBODIMENTS

First Embodiment

Figure 1:
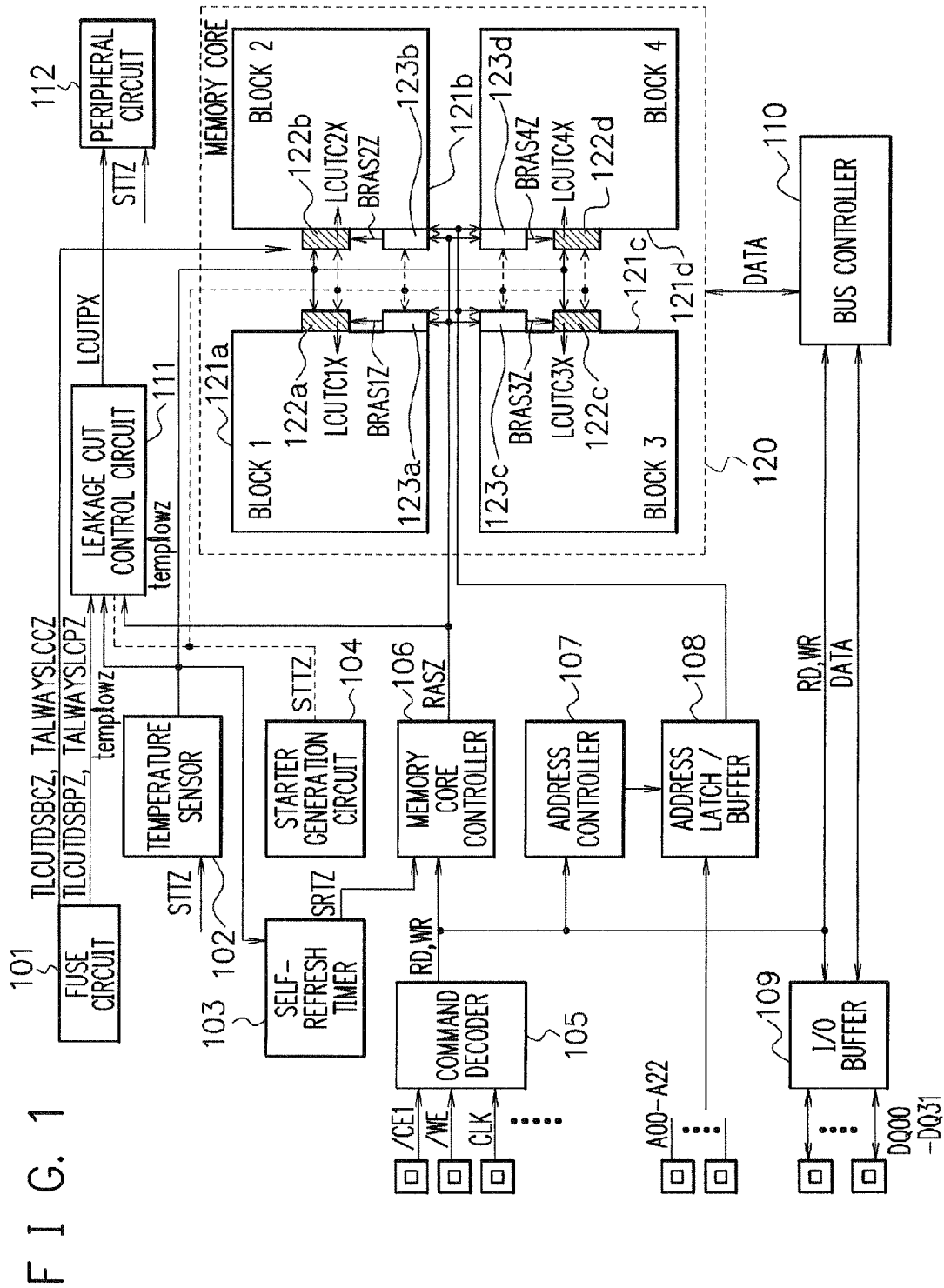
FIG. 1 is a block diagram illustrating a configuration example of a semiconductor memory device according to a first embodiment.

FIG. 1 is a block diagram illustrating a configuration example of a semiconductor memory device according to a first embodiment. The semiconductor memory device is, for example, a DRAM. A memory core 120, which is divided into, for example, four, has memory cell blocks 121a, 121b, 121c, 121d. The memory cell blocks 121a, 121b, 121c, 121d each have a plurality of memory cells, to/from which data can be written and read. The first memory cell block 121a is controlled by a first block control circuit 123a and a first leakage cut control circuit 122a. The second memory cell block 121b is controlled by a second block control circuit 123b and a second leakage cut control circuit 122b. The third memory cell block 121c is controlled by a third block control circuit 123c and a third leakage cut control circuit 122c. The fourth memory cell block 121d is controlled by a fourth block control circuit 123d and a fourth leakage cut control circuit 122d.

Figure 24:
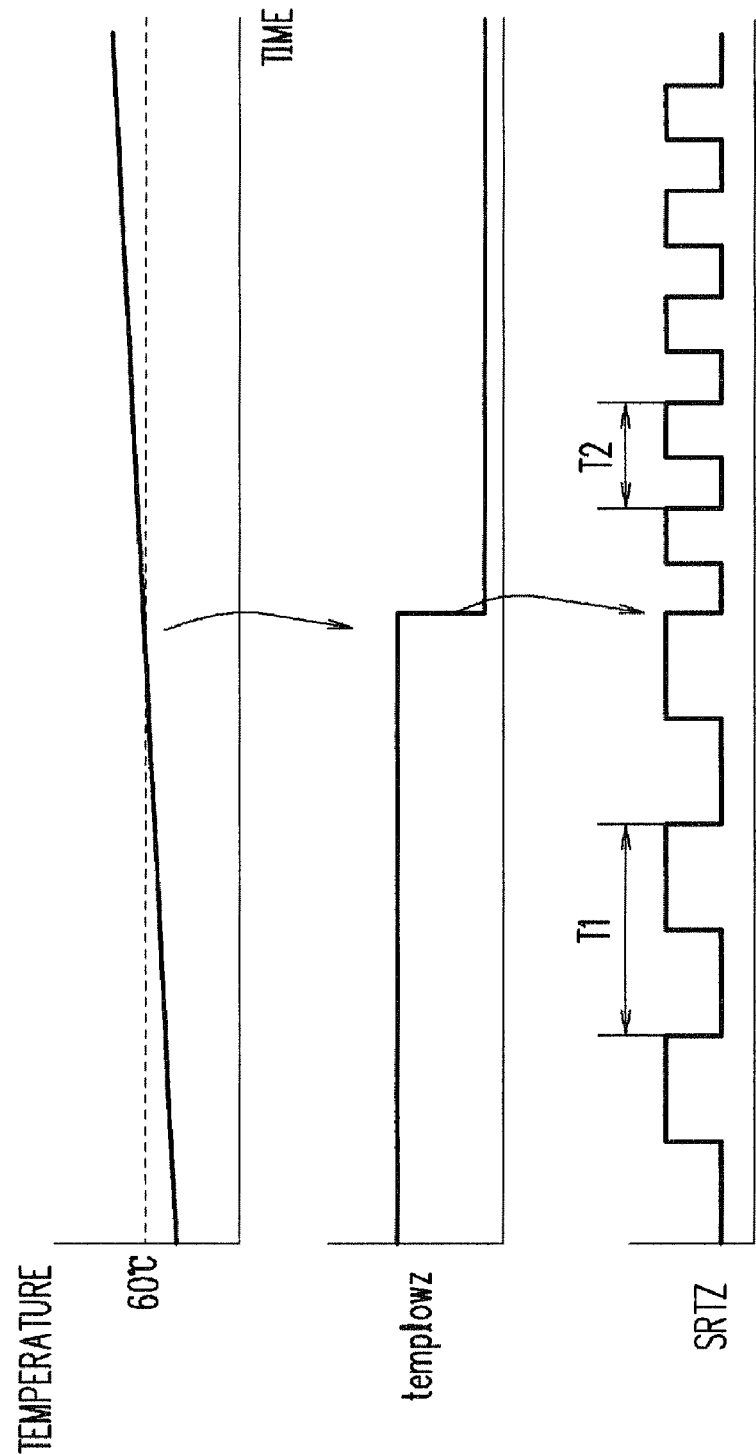
FIG. 24 is a chart illustrating a temperature signal and a refresh period signal.

FIG. 24 is a chart illustrating a temperature signal templowz and a refresh period signal SRTZ.

A starter generation circuit 104 generates a starter signal STTZ (see FIG. 9) upon power-on and outputs the starter signal STTZ to a leakage cut control circuit 111, the leakage cut control circuits 122a, 122b, 122c, 122d, a temperature sensor 102, and a peripheral circuit 112. The peripheral circuit 112 may be, for example, part of circuits in a memory core controller 106 or in an address controller 107. The temperature sensor 102 starts temperature detection after the starter signal STTZ changes from high level to low level, and as illustrated in FIG. 24, when the detected temperature is higher than a threshold value (for example, 60° C.), the temperature sensor 102 outputs a low-level temperature signal templowz, and when the detected temperature is equal to the threshold value (for example, 60° C.) or lower, it outputs a high-level temperature signal templowz. The configuration of the temperature sensor 102 is described with reference to FIG. 6 later.

Figure 22:
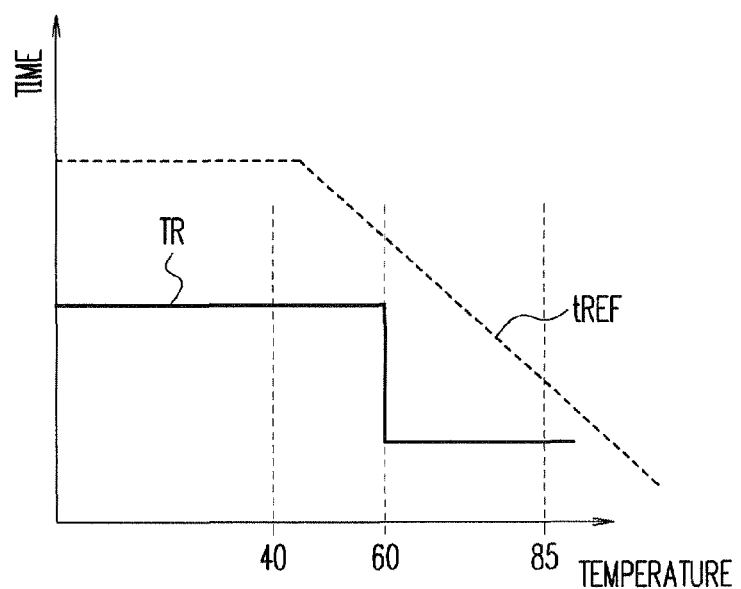
FIG. 22 is a graph illustrating a refresh period vs. temperature.

As illustrated in FIG. 22 and FIG. 24, a self-refresh timer 103 outputs the refresh period signal SRTZ of a refresh period TR according to the temperature signal templowz to the memory core controller 106. The refresh period TR is a long period T1 when the temperature signal templowz is at high level (temperature equal to 60° C. or lower), and is a short period T2 when the temperature signal templowz is at low level (temperature higher than 60° C.). The memory controller 106 outputs a memory core control signal RASZ at the refresh period TR indicated by the refresh period signal SRTZ to control a refresh operation.

A command decoder 105 receives a first chip enable signal/CE1, a write enable signal/WE, a clock signal CLK, and so on from an external part to output a read command RD and a write command WR to the memory core controller 106, the address controller 107, an I/O buffer 109, and a bus controller 110. The memory core controller 106 controls a read, write, or refresh operation by the memory core control signal RASZ. The address controller 107 controls an address latch/buffer 108 according to the read command RD or the write command WR. The address latch/buffer 108 receives address signals A00 to A22 from an external part and latches the input address signals A00 to A22 to output them to the block control circuits 123a to 123d. The I/O buffer 109 receives/outputs data DQ00 to DQ31 from/to an external part and receives/outputs data DATA from/to the bus controller 110. The bus controller 110 receives/outputs the DATA from/to the memory core 120.

A fuse circuit (memory) 101 stores mode signals TLCUTDSBPZ, TALWAYSLCPZ, TLCUTDSBCZ, TALWAYSLCCZ and outputs the mode signals TLCUTDSBPZ, TALWAYSLCPZ to the leakage cut control circuit 111 and outputs the mode signals TLCUTDSBCZ, TALWAYSLCCZ to the leakage cut control circuits 122a to 122d.

The leakage cut control circuit 111 receives the mode signals TLCUTDSBPZ, TALWAYSLCPZ, the temperature signal templowz, the starter signal STTZ, and the memory core control signal RASZ to output a leakage cut control signal LCUTPX to the peripheral circuit 112. The configuration of the leakage cut control circuit 111 is described with reference to FIG. 2 later. The peripheral circuit 112 may be, for example, part of circuits in the memory controller 106 or in the address controller 107. The configuration of the peripheral circuit 112 is described with reference to FIG. 4 later.

The block control circuits 123a to 123d receive the memory core control signal RASZ and the address signal to control the memory cell blocks 121a to 121d respectively, and output block control signals BRAS1Z, BRAS2Z, BRAS3Z, BRAS4Z to the leakage cut control circuits 122a to 122d respectively. The leakage cut control circuits 122a to 122d receive the mode signals TLCUTDSBCZ, TALWAYSLCCZ, the temperature signal templowz, the starter signal STTZ, and the block control signals BRAS1Z, BRAS2Z, BRAS3Z, BRAS4Z to output leakage cut control signals LCUTC1X, LCUTC2X, LCUTC3X, LCUTC4X to the memory cell blocks 121a, 121b, 121c, 121d respectively. The configuration of the leakage cut control circuits 122a to 122d is described with reference to FIG. 3 later. The configuration of part of the inside of the memory cell blocks 121a to 121d is described with reference to FIG. 5 later.

As described above, the memory core 120 is a memory core of the DRAM. The command decoder 105, the memory core controller 106, and the self-refresh timer 103 control the read, write, and refresh operations for the memory core 120. The address controller 107 and the address latch/buffer 108 decide addresses of the respective operations. The I/O buffer 109 and the bus controller 110 receive/output data from/to the memory core 120 to/from an external part. The starter generation circuit 104 generates the starter signal STTZ for deciding a state at the startup time and an initial state after the startup time. The self-refresh timer 103 changes the refresh period TR indicated by the refresh period signal SRTZ depending on the temperature signal templowz of the temperature sensor 102.

The leakage cut control circuit 111 receives the memory core control signal RASZ, the temperature signal templowz, the starter signal STTZ, and the mode signals TALWAYSLCPZ, TLCUTDSBPZ. The mode signals TALWAYSLCPZ, TLCUTDSBPZ are capable of instructing a first mode in which the leakage cut control is performed according to temperature, a second mode in which the leakage cut control is constantly performed, and a third mode in which the leakage cut control is not performed at all, which is described later.

The leakage cut control circuits 122a to 122d receive the block control signals BRAS1Z to BRAS4Z containing logic of block selection instead of the memory core control signal RASZ, and further receive the temperature signal templowz, the starter signal STTZ, and the mode signals TALWAYSLCCZ, TLCUTDSBCZ. The mode signals TALWAYSLCCZ, TLCUTDSBCZ are the same signals as the aforesaid mode signals TALWAYSLCPZ, TLCUTDSBPZ.

Figure 4:
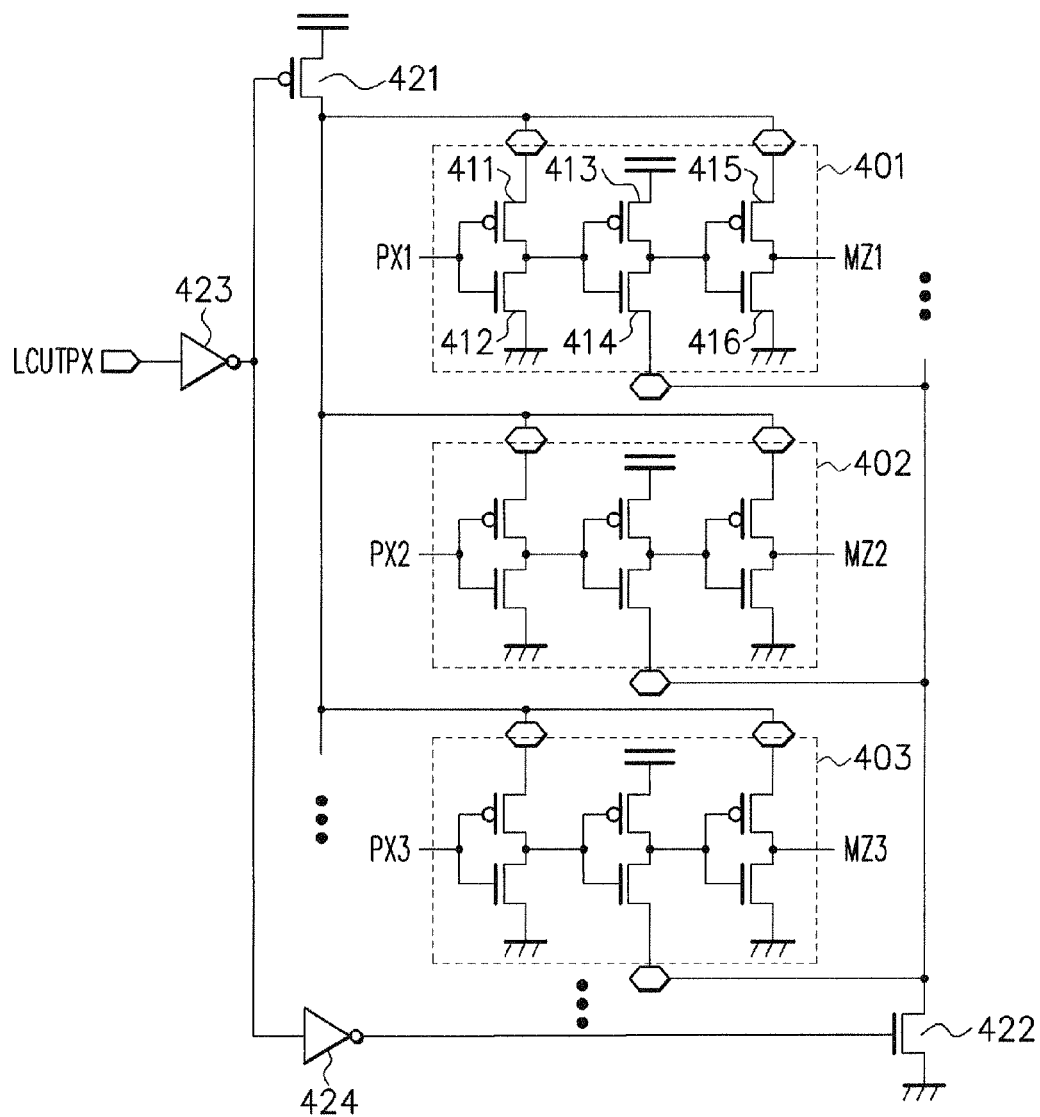
FIG. 4 is a circuit diagram illustrating a configuration example of part of the inside of a peripheral circuit.

FIG. 4 is a circuit diagram illustrating a configuration example of part of the inside of the peripheral circuit 112. A delay circuit 401 delays a signal PX1 to output a signal MZ1. A delay circuit 402 delays a signal PX2 to output a signal MZ2. A delay circuit 403 delays a signal PX3 to output a signal MZ3.

The configuration of the delay circuit 401 is described. A p-channel field effect transistor 411 and an n-channel field effect transistor 412 form an inverter and receive the input signal PX1. A source of the transistor 411 is connected to a power supply line of a power supply voltage via a p-channel field effect transistor 421. A source of the transistor 412 is connected to a power supply line of a reference potential (ground potential). A p-channel field effect transistor 413 and an n-channel field effect transistor 414 form an inverter. A source of the transistor 413 is connected to the power supply line of the power supply voltage. A source of the transistor 414 is connected to the power supply line of the reference potential via an n-channel field effect transistor 422. A p-channel field effect transistor 415 and an n-channel field effect transistor 416 form an inverter and output the output signal MZ1. A source of the transistor 415 is connected to the power supply line of the power supply voltage via the transistor 421. A source of the transistor 416 is connected to the power supply line of the reference potential. By connecting the sources of the odd-numbered inverters to the p-channel field effect transistor 421 and connecting the source of the even-numbered inverter to the n-channel field effect transistor 422, it is possible to prevent an indefinite value from being output. The delay circuits 402 and 403 also have the same configuration as that of the delay circuit 401.

The transistors 421 and 422 are transistors for the leakage cut control. A gate of the p-channel field effect transistor 421 receives the leakage cut control signal LCUTPX via an inverter 423. A gate of the n-channel field effect transistor 422 receives the leakage cut control signal LCUTPX via the inverter 423 and an inverter 424. When the leakage cut control signal LCUTPX turns to low level, the transistors 421 and 422 turn off, and when the leakage cut control signal LCUTPX turns to high level, the transistors 421 and 422 turn on. In a standby period, the leakage cut control to turn off the transistors 421 and 422 is performed to reduce a leakage current in the standby period, which can reduce power consumption of the semiconductor memory device. Note that the peripheral circuit 112 is not limited to the delay circuit and may be a logic circuit other than the delay circuit.

FIG. 5 is a circuit diagram illustrating a configuration example of part of the inside of the memory blocks 121a to 121d and illustrates a configuration example of, for example, a word decoder. The word decoder has p-channel field effect transistors 501, 505, 507, 508, 510 and n-channel field effect transistors 502 to 504, 506, 509, 511, and receives signals bPRCH, X23P, X78P, X456P to output a word line signal bMWL. A power supply voltage VPP is 3 V. a reference potential VSS is 0 V, and a step-down potential VNN is −0.3 V.

A plurality of the word decoders each have a terminal BKEDX. An n-channel field effect transistor 520 has a gate connected to lines of the leakage cut control signals LCUTC#X (X represents 1 to 4), a drain connected to the plural terminals BKEDX, and a source connected to a power supply line of the step-down potential VNN. When the leakage cut control signal LCUTC#X turns to low level, the transistor 520 turns off, and when the leakage cut control signal LCUTC#X turns to high level, the transistor 520 turns on. The transistor 520 performs the leakage cut control in which it turns off in the standby period and turns on in refresh, read, and write operations. This can reduce a leakage current in the standby period, enabling a reduction in power consumption of the semiconductor memory device.

At the startup time, the signals bPRCH and X23P turn to low level, so that the transistor 501 turns on and a transistor X23P turns off. However, in a state where the power supply voltage VPP does not reach a predetermine value at the startup time, the transistor 509 does not completely turn on and a gate of the transistor 506 has an indefinite value and the transistor 506 can either turn on or off. When the transistor 506 is on, changing the leakage cut control signal LCUTC#X to high level at the startup time causes the transistor 520 to turn on, so that a shoot-through current of the power supply voltage VPP is generated via the transistors 501, 505, 506, 520. As a result, the power supply voltage VPP does not rise to a predetermined level, which may possibly cause poor startup. Therefore, at the startup time, the leakage cut control signal LCUTC#X is set to low level irrespective of the temperature to prevent the generation of the shoot-through current of the power supply voltage VPP.

Figure 11:
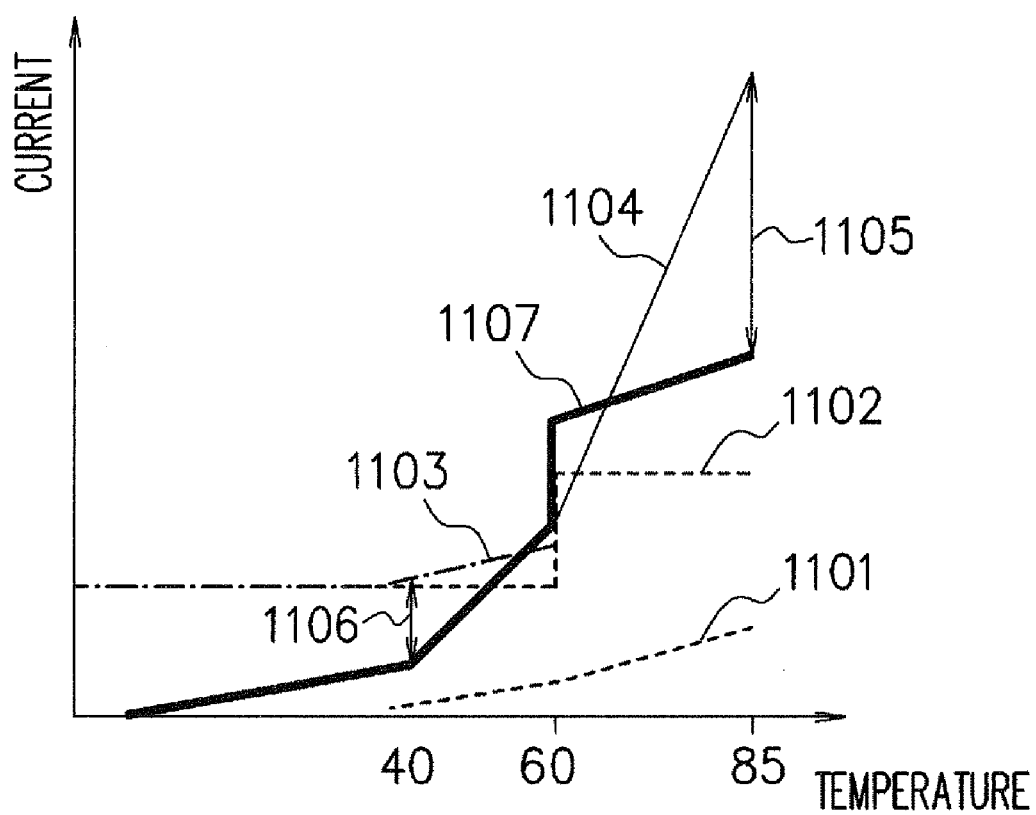
FIG. 11 is a graph illustrating a temperature characteristic of a standby current when leakage cut control according to the first embodiment is performed.
Figure 23:
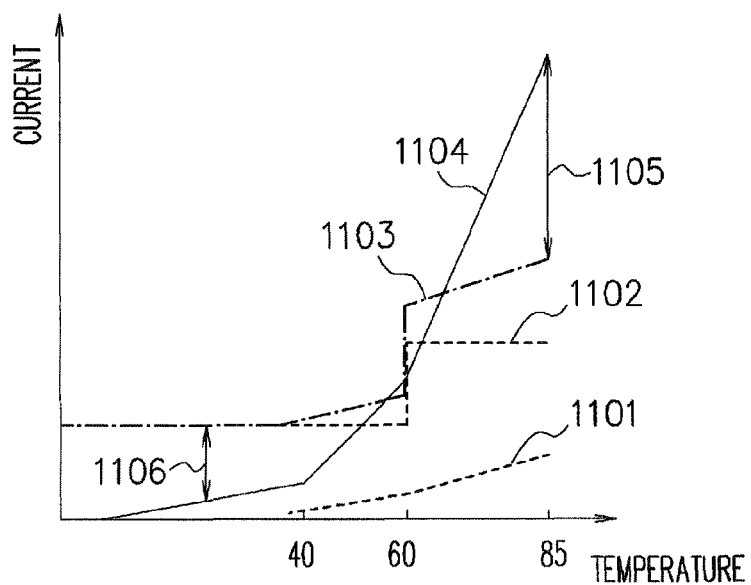
FIG. 23 is a chart illustrating temperature characteristics of standby currents.

FIG. 11 is a graph illustrating a temperature characteristic of a standby current when the leakage cut control according to this embodiment is performed. A horizontal axis represents temperature [°] and a vertical axis represents current. A leakage current 1101, an AC current 1102, a standby current 1103, and a standby current 1104 are the same as those in FIG. 23. The leakage current 1104 represents a leakage current in the standby period when the leakage cut control is not performed and thus the transistors 421, 422, 520 are constantly kept on (hereinafter referred to as an off leakage current). The current 1103 is a current equal to the sum of the leakage current 1101 and the AC current 1102 and represents a current in the standby period when the leakage cut control is performed. The leakage current 1101 is a leakage current in the standby period when the leakage cut control is performed. The AC current 1102 is an AC current of gate signals of the transistors 421, 422, 520 for the leakage cut control. As illustrated in FIG. 22, when the temperature is 60° C. or lower, since the refresh period TR is long, the AC current 1102 is small, and when the temperature is higher than 60° C., since the refresh period TR is short, the AC current 1102 is large.

In this embodiment, when the temperature detected by the temperature sensor 102 is higher than 60° C., the leakage cut control is performed, and when the temperature detected by the temperature sensor 102 is equal to 60° C. or lower, the leakage cut control is not performed and thus the transistors 421, 422, 520 are constantly kept on, so that the standby current 1107 is generated. When the temperature is higher than 60° C., the standby current 1107 is equal to the standby current 1103 under the leakage cut control, and when the temperature is equal to or lower than 60° C., the standby current 1107 is equal to the standby current 1104 under no leakage cut control.

When the temperature detected by the temperature sensor 102 is equal to 60° C. or lower, for example, the refresh period TR is twice as long and the AC current 1102 is reduced to ½ compared with those when the temperature is higher than 60° C. The off leakage current 1104 changes exponentially with the temperature. When the temperature is as high as about 85° C., since the AC current 1102 ascribable to the leakage cut control is smaller than the off leakage current 1104, performing the leakage cut control can make the total standby current 1107 smaller than the off leakage current 1104 by a current difference 1105. Further, at room temperature of about 40° C. or lower, the off leakage current 1104 reduces at a rate of a digit according to an exponential function but the AC current 1102 reduces only to about ½, compared with those when the temperature is higher than 60° C. Therefore, at room temperature of 60° C. or lower, the standby current 1107 under no leakage cut control becomes smaller than the standby current 1103 under the leakage cut control by a current difference 1106. Therefore, the standby current 1107 can be reduced both at high temperatures and at room temperatures or lower.

As described above, in this embodiment, the temperature sensor 102 is mounted, and when the temperature is determined as higher than 60° C., the leakage cut control is performed to reduce the off leakage current 1101, thereby reducing the total standby current 1107, and when the temperature is determined as room temperature of 60° C. or lower, the leakage cut control is not performed to constantly keep the leakage cut transistors 421, 422, 520 on except at the startup time, thereby preventing the generation of the AC current 1102 which is generated when the leakage cut control is performed. By these measures, it is possible to reduce the standby current 1107 both at high temperatures and at room temperatures or lower.

Next, three modes set by the mode signals TALWAYSLCPZ, TALWAYSLCCZ, TLCUTDSBPZ, TLCUTDSBCZ in FIG. 1 are described. A first mode is indicated by low level of the mode signals TALWAYSLCPZ and TALWAYSLCCZ and low level of the mode signals TLCUTDSBPZ and TLCUTDSBCZ, and in the first mode, the leakage cut control is not performed when the temperature is 60° C. or lower and the leakage cut control is performed when the temperature is higher than 60° C. as described.

Incidentally, when the process fluctuates to such an extent that the off leakage current 1104 at 60° C. or lower becomes larger than the AC current 1102 under the leakage cut control, constantly performing the leakage cut control sometimes enables a more reduction in the total standby current. Further, in some case the same semiconductor chip is used and the semiconductor device is used for the application not requiring the reduction in the standby current at room temperatures or lower.

In these cases, the fuse circuit 101 is mounted in the semiconductor chip, and when a fuse of the fuse circuit 101 is not blown, the mode signals TALWAYSLCPZ and TALWAYSLCCZ are set to low level to set the aforesaid first mode, where the leakage cut control is performed at temperatures higher than 60° C. and the leakage cut control is not performed at 60° C. or lower.

The operation can be changed in such a manner that, when the fuse of the fuse circuit 101 is blown, the mode signals TALWAYSLCPZ and TALWAYSLCCZ are set to high level to set the second mode, where the leakage cut is constantly performed.

On the other hand, the operation can be switched in such a manner that, when the off leakage current 1104 at a temperature higher than 60° C. is smaller than the AC current 1102 ascribable to the leakage cut control and constantly keeping the leakage cut transistors 421, 422, 520 on without performing the leakage cut control irrespective of the temperature enables a more reduction in the total standby current, or when the same semiconductor chip is used and the semiconductor device is used for the application where the requirement for the standby current can be satisfied without performing the leakage cut control at all the temperatures, the fuse of the fuse circuit 101 is blown and the mode signals TLCUTDSBPZ and TLCUTDSBCZ are set to high level to set the third mode, where the leakage cut control is not performed at all and thus the leakage cut transistors 421, 422, 520 are turned on.

As described above, according to fuse information of the fuse circuit 101, the mode can be changed among three modes, that is, the first mode in which the leakage cut control is performed at temperatures higher than 60° C. and the leakage cut control is not performed at 60° C. or lower, the second mode in which the leakage cut control is performed both at temperatures higher than 60° C. and at 60° C. or lower, and the third mode in which the leakage cut control is performed neither at temperatures higher than 60° C. nor at 60° C. or lower and the leakage cut transistors 421, 422, 520 are constantly kept on, which widens applicable process range and usage. Further, in this embodiment, it is possible to switch among the three modes independently by the mode signals TALWAYSLCCZ and TLCUTDSBCZ of the leakage cut control circuits 122a to 122d for the memory cell blocks 121a to 121d and by the mode signals TALWAYSLCPZ and TLCUTDSBPZ of the leakage cut control circuit 111 for the peripheral circuit 112.

Figure 6:
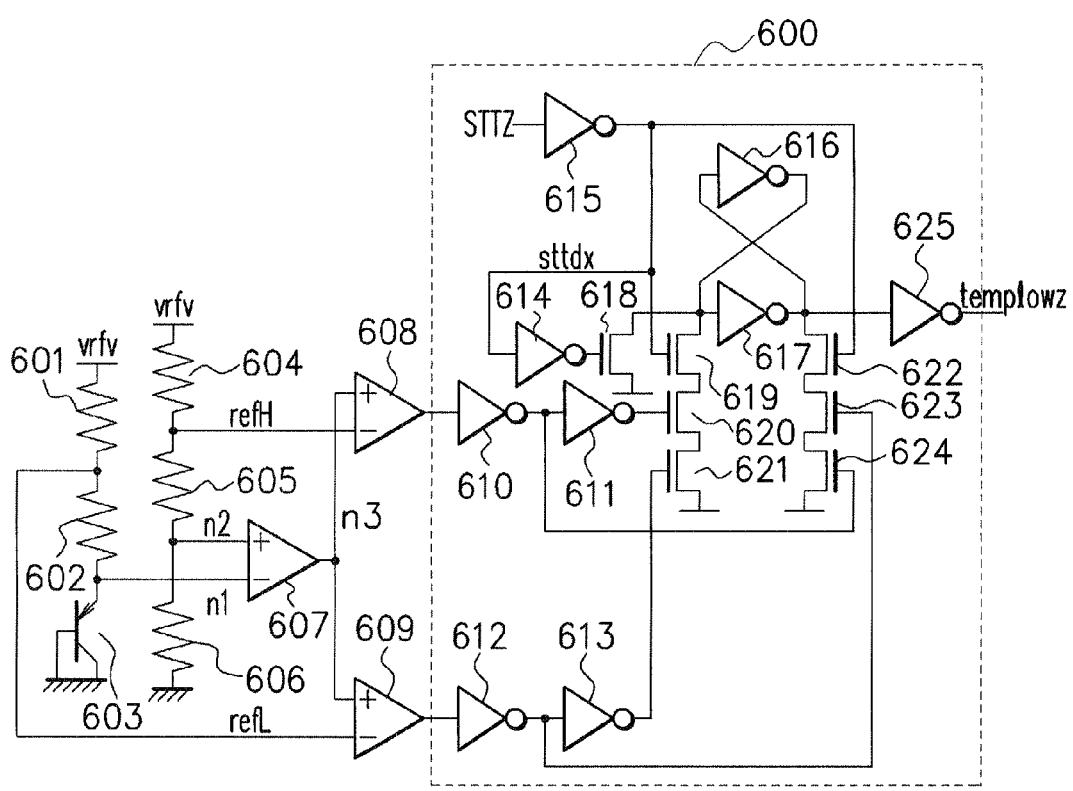
FIG. 6 is a circuit diagram illustrating a configuration example of a temperature sensor in FIG. 1.

FIG. 6 is a circuit diagram illustrating a configuration example of the temperature sensor 102 in FIG. 1, FIG. 7 is a graph illustrating temperature characteristics of node voltages n1 and n2 in FIG. 6, and FIG. 8 is a graph illustrating a temperature characteristic of a node voltage n3 in FIG. 6. Note that FIG. 7 illustrates voltages of the vertical axis in an enlarged manner compared with that in FIG. 8.

The temperature sensor 102 has a Schumitt trigger circuit (flip-flop) 600. Resistors 601, 602 and a pnp transistor 603 are connected in series between a voltage vrfv and a ground potential. A base of the transistor 603 is connected to the ground potential. Resistors 604, 605, 606 are connected in series between the voltage vrfv and the ground potential. An operational amplifier 607 has a + terminal connected to the node voltage n2 between the resistors 605 and 606 and a − terminal connected to the node voltage n1 between the resistor 602 and the transistor 603, and outputs the node voltage n3 from an output terminal. As illustrated in FIG. 7, the node voltage n2 is constant irrespective of the temperature, and the node voltage n1 becomes lower as the temperature becomes higher. The node voltage n1 is a voltage dependent on a threshold voltage of the transistor 603 and is dependent on the temperature. As illustrated in FIG. 7 and FIG. 8, the operational amplifier 607 outputs the node voltage n3 which is equal to the node voltage n2 from which the node voltage n1 is subtracted.

An operational amplifier 608 has a + terminal connected to the node voltage n3 and a − terminal connected to a reference voltage refH of a node between the resistors 604 and 605. An operational amplifier 609 has a + terminal connected to the node voltage n3 and a − terminal connected to a reference voltage refL of a node between the resistors 601 and 602. As illustrated in FIG. 8, the reference voltage refH is a voltage higher than the reference voltage refL. The operational amplifier 608 outputs a voltage equal to the node voltage n3 from which the reference voltage refH is subtracted. The operational amplifier 609 outputs a voltage equal to the node voltage n3 from which the reference voltage refL is subtracted. Incidentally, since the reference voltage refL is a voltage dependent on the threshold voltage of the transistor 603 and becomes higher as the temperature becomes lower, the operational amplifier 609 can increase an operating margin.

An inverter 610 receives an output signal of the operational amplifier 608. An inverter 611 receives an output signal of the inverter 610. An inverter 612 receives an output signal of the operational amplifier 609. An inverter 613 receives an output signal of the inverter 612. An inverter 615 receives the starter signal STTZ to output a signal sttdx. An inverter 614 receives the signal sttdx.

Three n-channel field effect transistors 619 to 621 are connected in series between an input terminal of an inverter 617 and a reference potential. A gate of the transistor 619 is connected to the signal sttdx, a gate of the transistor 620 is connected to an output terminal of the inverter 611, and a gate of the transistor 621 is connected to an output terminal of the inverter 613.

Three n-channel field effect transistors 622 to 624 are connected in series between an output terminal of the inverter 617 and the reference potential. A gate of the transistor 622 is connected to the signal sttdx, a gate of the transistor 623 is connected to an output terminal of the inverter 621, and a gate of the transistor 624 is connected to an output terminal of the inverter 610.

An n-channel field effect transistor 618 has a drain connected to the input terminal of the inverter 617, a gate connected to an output terminal of the inverter 614, and a source connected to the reference potential. An inverter 616 has an input terminal connected to the output terminal of the inverter 617 and an output terminal connected to the input terminal of the inverter 617. The inverters 616 and 617 form a memory element. An inverter 625 outputs, as the temperature signal templowz, a logic-inverted signal of an output signal of the inverter 617.

Figure 9:
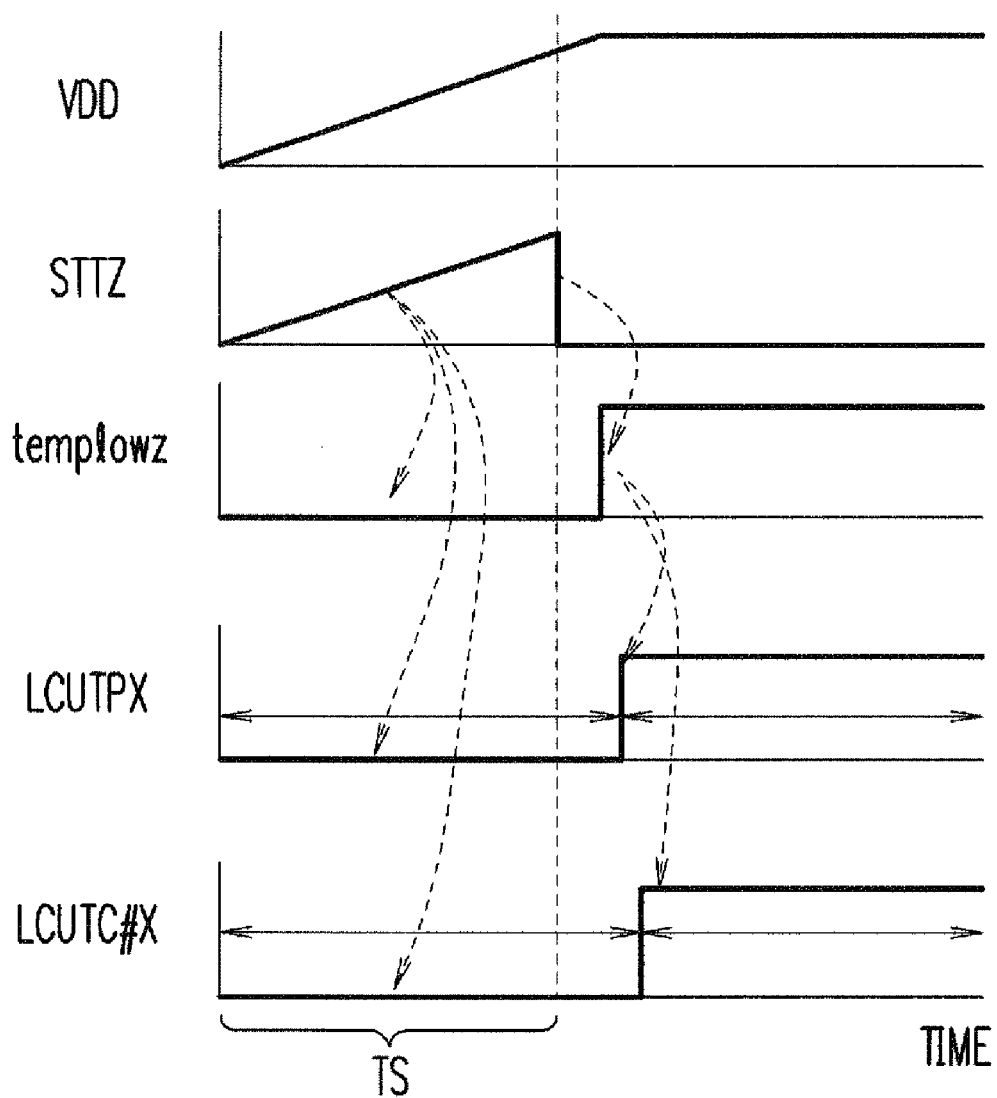
FIG. 9 is a timing chart for explaining the operation of the leakage cut control circuit in a first mode at 60° C. or lower.

As illustrated in FIG. 9, the starter signal STTZ gradually rises with the power supply voltage VDD at the startup time, and the starter signal STTZ turns to low level after a startup period TS. In the startup period TS, the starter signal STTZ is at high level, the transistors 619 and 622 turn off, the transistor 618 turns on, and the temperature signal templowz is at low level.

After the startup period TS, the starter signal STTZ changes to low level, the transistors 619 and 622 turn on, and the transistor 618 turns off. As illustrated in FIG. 8, when the temperature is higher than 60° C., the node voltage n3 becomes higher than the reference voltages refH and refL, the operational amplifier 608 outputs high level, and the operational amplifier 609 also outputs high level. The transistors 620 and 621 turn on and the transistors 623 and 624 turn off. As a result, as illustrated in FIG. 24, the temperature signal templowz turns to low level when the temperature is higher than 60° C. The period T2 of the refresh period signal SRTZ becomes short.

On the other hand, as illustrated in FIG. 8, when the temperature is equal to or lower than 60° C., the node voltage n3 becomes lower than the reference voltages refH and refL, the operational amplifier 608 outputs low level, and the operational amplifier 609 also outputs low level. The transistors 620 and 621 turn off and the transistors 623 and 624 turn on. As a result, as illustrated in FIG. 24, when the temperature is equal to or lower than 60° C., the temperature signal templowz turns to high level. The period T1 of the refresh period signal SRTZ becomes long.

As described above, the node voltage n1 has temperature dependency, reflecting the threshold voltage of the transistor 603, while the node voltage n2 does not have temperature dependency since it is generated by resistance voltage division. The operational amplifier 607 compares these node voltages n1 and n2 to output the node voltage n3 as the temperature detection result, but at this time, the output changes every short period when the temperature is at the boundary of 60° C., and in order to avoid this, the Schumitt trigger circuit 600 is further connected on a subsequent stage. When the temperature is higher than 60° C., the temperature signal templowz turns to low level, and when the temperature is equal to or lower than 60° C., the temperature signal templowz turns to high level.

Figure 2:
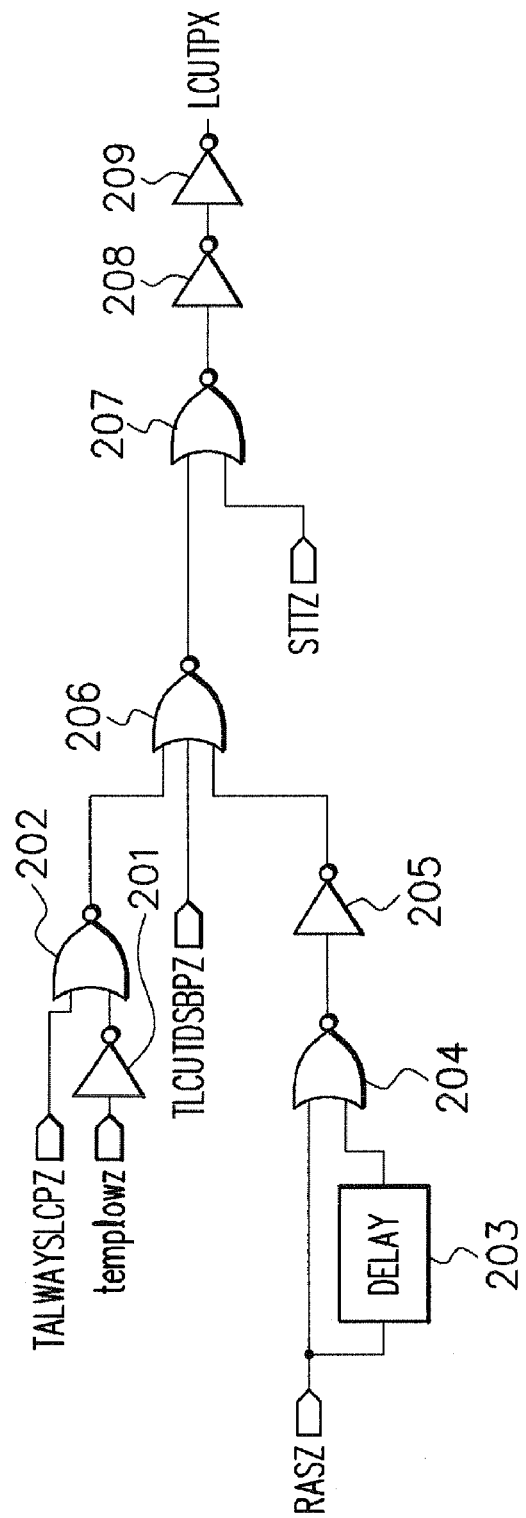
FIG. 2 is a circuit diagram illustrating a configuration example of a leakage cut control circuit in FIG. 1.

FIG. 2 is a circuit diagram illustrating a configuration example of the leakage cut control circuit 111 in FIG. 1. An inverter 201 outputs a logic-inverted signal of the temperature signal templowz. A negative-OR circuit (NOR) 202 outputs a negative-OR signal of the output signal of the inverter 201 and the mode signal TALWAYSLCPZ. A delay circuit 203 delays the memory core control signal RASZ to output it. The delay circuit 203 is provided in order to delay the fall of the leakage cut control signal LCUTPX from the fall of the memory core control signal RASZ in FIG. 10. A negative-OR circuit 204 outputs a negative-OR signal of the output signal of the delay circuit 203 and the memory core control signal RASZ. An inverter 205 outputs a logic-inverted signal of the output signal of the negative-OR circuit 204. A negative-OR circuit 206 outputs a negative-OR signal of the output signal of the negative-OR circuit 202, the mode signal TLCUTDSBPZ, and the output signal of the inverter 205. A negative-OR circuit 207 outputs a negative-OR signal of the output signal of the negative-OR circuit 206 and the starter signal STTZ. An inverter 208 outputs a logic-inverted signal of the output signal of the negative-OR circuit 207. An inverter 209 outputs, as the leakage cut control signal LCUTPX, a logic-inverted signal of the output signal of the inverter 208.

For the same reason as that explained in the above with reference to FIG. 5, when the starter signal STTZ at the startup time is at high level, the leakage cut control signal LCUTPX is set to low level to turn off the leakage cut transistors 421 and 422.

In the first mode, the mode signals TALWAYSLCPZ and TLCUTDSBPZ are at low level. The operation in the first mode is described with reference to FIG. 9 and FIG. 10 later.

In the second mode, the mode signal TALWAYSLCPZ is at high level and the mode signal TLCUTDSBPZ is at low level. When the memory cell blocks 121a to 121d are in operation, that is, when the memory core signal RASZ turns to high level, the leakage cut control signal LCUTPX turns to high level and the leakage cut transistors 421 and 422 turn on. On the other hand, when the memory cell blocks 121a to 121d are in non-operation, that is, when the memory core control signal RASZ turns to low level, the leakage cut control signal LCUTPX turns to low level and the leakage cut transistors 421 and 422 turn off. That is, irrespective of the temperature signal templowz, the leakage cut control is constantly performed.

In the third mode, the mode signal TALWAYSLCPZ is at low level and the mode signal TLCUTDSBPZ is at high level. Irrespective of the temperature signal templowz and the memory core control signal RASZ, the leakage cut control signal LCUTPX turns to high level and the leakage cut transistors 421 and 422 constantly turn on.

Figure 3:
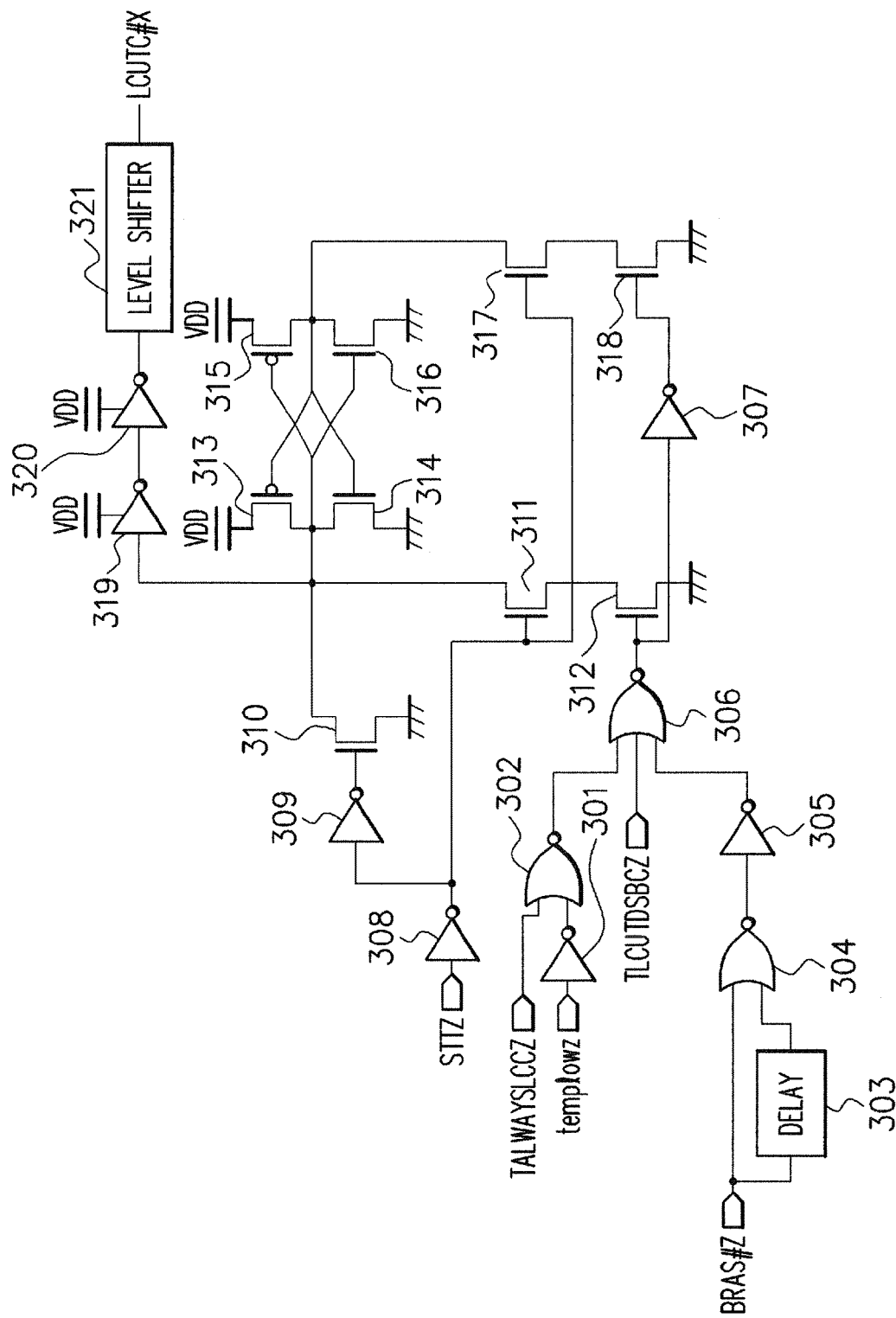
FIG. 3 is a circuit diagram illustrating a configuration example of a leakage cut control circuit in FIG. 1.

FIG. 3 is a circuit diagram illustrating a configuration example of each of the leakage cut control circuits 122a to 122d in FIG. 1. What makes the circuit in FIG. 3 different from the circuit in FIG. 2 is described. The block control signal BRAS#Z (# is one of integers 1 to 4) in FIG. 3 replaces the memory core control signal RASZ in FIG. 2, the leakage cut control signal LCUTC#X (# is one of integers 1 to 4) in FIG. 3 replaces the leakage cut control signal LCUTPX in FIG. 2, the mode signal TALWAYSLCCZ in FIG. 3 replaces the mode signal TALWAYSLCPZ in FIG. 2, and the mode signal TLCUTDSBCZ in FIG. 3 replaces the mode signal TLCUTDSBPZ in FIG. 2. The circuit in FIG. 3 is a circuit performing the same logic operation as that of the circuit in FIG. 2. That is, the input/output relations of the both are the same.

In the leakage cut control circuit 111 in FIG. 2, the power supply voltage is VII (1.6 V) and the reference potential is the ground potential (0 V). On the other hand, in the memory cell blocks 121a to 121d in FIG. 5, the power supply voltage is VPP (3 V) and the reference potential is VNN (−0.3 V). Therefore, the leakage cut control circuits 122a to 122d in FIG. 3 are each structured such that a level shift circuit is added to the leakage cut control circuit 111 in FIG. 2.

Circuit elements 301 to 306 in FIG. 3 correspond to the circuit elements 201 to 206 in FIG. 2. The circuit in FIG. 3 is structured such that the circuit elements 207 to 209 are deleted from the circuit in FIG. 2 and the following circuit elements are added. An inverter 307 outputs a logic-inverted signal of an output signal of the negative-OR circuit 306. An inverter 308 outputs a logic-inverted signal of the starter signal STTZ. An inverter 309 outputs a logic-inverted signal of the output signal of the inverter 308. An n-channel field effect transistor 310 has a drain connected to an input terminal of an inverter 319, a gate connected to an output terminal of the inverter 309, and a source connected to a ground potential. N-channel field effect transistors 311 and 312 are connected in series between the input terminal of the inverter 319 and the ground potential. A gate of the transistor 311 is connected to an output terminal of the inverter 308, and a gate of the transistor 312 is connected to an output terminal of the negative-OR circuit 306.

A p-channel field effect transistor 313 and an n-channel field effect transistor 314 are connected in series between a power supply voltage VDD (1.8 V) and the ground potential. A p-channel field effect transistor 315 and an n-channel field effect transistor 316 are connected in series between the power supply voltage VDD and the ground potential. Gates of the transistors 313 and 314 are connected to drains of the transistors 315 and 316. Gates of the transistors 315 and 316 are connected to the input terminal of the inverter 319 via drains of the transistors 313 and 314.

N-channel field effect transistors 317 and 318 are connected in series between an interconnection point of the drains of the transistors 315 and 316 and the ground potential. A gate of the transistor 317 is connected to the output terminal of the inverter 308 and a gate of the transistor 318 is connected to an output terminal of the inverter 307.

The inverter 319 is connected to the power supply voltage VDD and outputs a logic-inverted signal of an input signal. An inverter 320 is connected to the power supply voltage VDD and outputs a logic-inverted signal of the output signal of the inverter 319. A level shifter 321 level-shifts the signal from the power supply voltage VDD (1.8 V) to the power supply voltage VPP (3 V) and outputs the leakage cut control signal LCUTC#X (# is one of integers 1 to 4).

The circuit in FIG. 3 is different from the circuit in FIG. 2 in that it level-shifts the power supply voltage VII (1.6 V) to the power supply voltage VDD (1.8 V) and level-shifts the power supply voltage VDD to the power supply voltage VPP (3 V).

As described above, the circuit in FIG. 3 is the same as the circuit in FIG. 2 in that their logic operations are the same. In the circuit in FIG. 3, the memory cell blocks 121a to 121d being leakage cut controlled circuits on subsequent stages use power supplies of VPP (3 V) and VNN (−0.3 V), and therefore, an amplitude of the output of the circuit in FIG. 3 is also level-shifted to VPP-VSS (0 V) or VII-VNN to output the resultant. In the first mode, in a ROW-related operation, the control signal RASZ or BRASZ turns to high level to turn on the leakage cut transistors 421, 422, 520. When the Row-related operation is finished, after a predetermined delay time passes from the time when the control signal RASZ or BRASZ turns to low level, the leakage cut transistors 421, 422, 502 are turned off. Operational waveforms of the signal RASZ/BRASZ and the signals STTZ, LCUTC#X (#=1 to 4)/LCUTPX are described with reference to FIG. 9 and FIG. 10 later.

FIG. 9 is a timing chart for explaining the operation of the leakage cut control circuits in FIG. 2 and FIG. 3 in the first mode when the temperature is 60° C. or lower. When the power supply voltage VDD increases at the startup time, the starter signal STTZ also rises at the same time in the startup period TS. When it is detected that the power supply voltage VDD has increased to a predetermined level, the starter signal STTZ is reset to low level. A case where in a high-level period of the starter signal STTZ, the output signal templowz of the temperature sensor 102 is fixed to low level is illustrated, but when the output signal templowz is not fixed, the operation thereafter is the same. After the starter signal STTZ turns to low level, the temperature sensor 102 starts the temperature detection operation, and when detecting that the temperature is 60° C. or lower, the temperature sensor 102 outputs high level as the temperature signal templowz. Accordingly, the leakage cut control signal LCUTPX turns to high level, the leakage cut transistors 421 and 422 of the peripheral circuit 112 are kept constantly on, the leakage cut control signal LCUTC#X (#=1 to 4) turns to high level, and the leakage cut transistor 520 of the memory cell blocks 121*a* to 121*d* are constantly kept on.

FIG. 10 is a timing chart for explaining the operation of the leakage cut control circuits in FIG. 2 and FIG. 3 in the first mode when the temperature is higher than 60° C. As an example, a case is given where after the startup, a write request signal WR_BLK1 is input to the first memory cell block 121*a*, a read request signal RD_BLK1 is input to the first memory cell block 121*a*, and refresh request signals REF_BLK3, REF_BLK4 are input to the third and fourth memory cell blocks 121*c*, 121*d*. Here, it is assumed that in a refresh operation, the first memory cell block 121*a* and the second memory cell block 121*b* operate simultaneously, and the third memory cell block 121*c* and the fourth memory cell block 121*d* operate simultaneously.

When the power supply voltage VDD increases at the startup time, the starter signal STTZ also rises at the same time. When it is detected that the power supply voltage VDD has increased to a predetermined level, the starter signal STTZ is reset to low level. After the starter signal STTZ turns to low level, the temperature sensor 102 starts the temperature detection operation and when detecting that the temperature is higher than 60° C., it continues outputting low level as the temperature signal templowz as is output at the startup time. The leakage cut transistors 421 and 422 of the peripheral circuit 112 and the leakage cut transistor 520 of the memory cell blocks 121*a* to 121*d* are both kept in the off state. When the write request signal WR_BLK1, the read request signal RD_BLK1, the refresh request signals REF_BLK3, REF_BLK4 are thereafter input, the leakage cut control signal LCUTPX of the peripheral circuit 112 common to the blocks rises in response to the rise of the common Row activation signal RASZ, and falls at a timing delayed from the fall of the signal RASZ.

The leakage cut control signals LCUTC#X only for the blocks to which the request signals are input rise in response to the Row activation signals BRAS#Z (# is 1 to 4 representing the block number) independent for each block, and fall at a timing delayed from the fall of the signals BRAS#Z. The reason why the fall of the leakage cut control signals LCUTC#X is delayed is to enable the operation immediately after the fall of the block control signals BRAS#Z.

For example, in the first memory cell block 121*a*, the block control signal BRAS1Z becomes the same signal as the memory core control signals WR_BLK1 and RD_BLK1, and the leakage cut control signal LCUTC1X is a signal responding to the block control signal BRAS1Z. Further, in the third memory cell block 121*c*, the block control signal BRAS3Z becomes the same signal as the memory core control signal REF_BLK3, and the leakage cut control signal LCUTC3X is a signal responding to the block control signal BRAS3Z.

Second Embodiment

Figure 12:
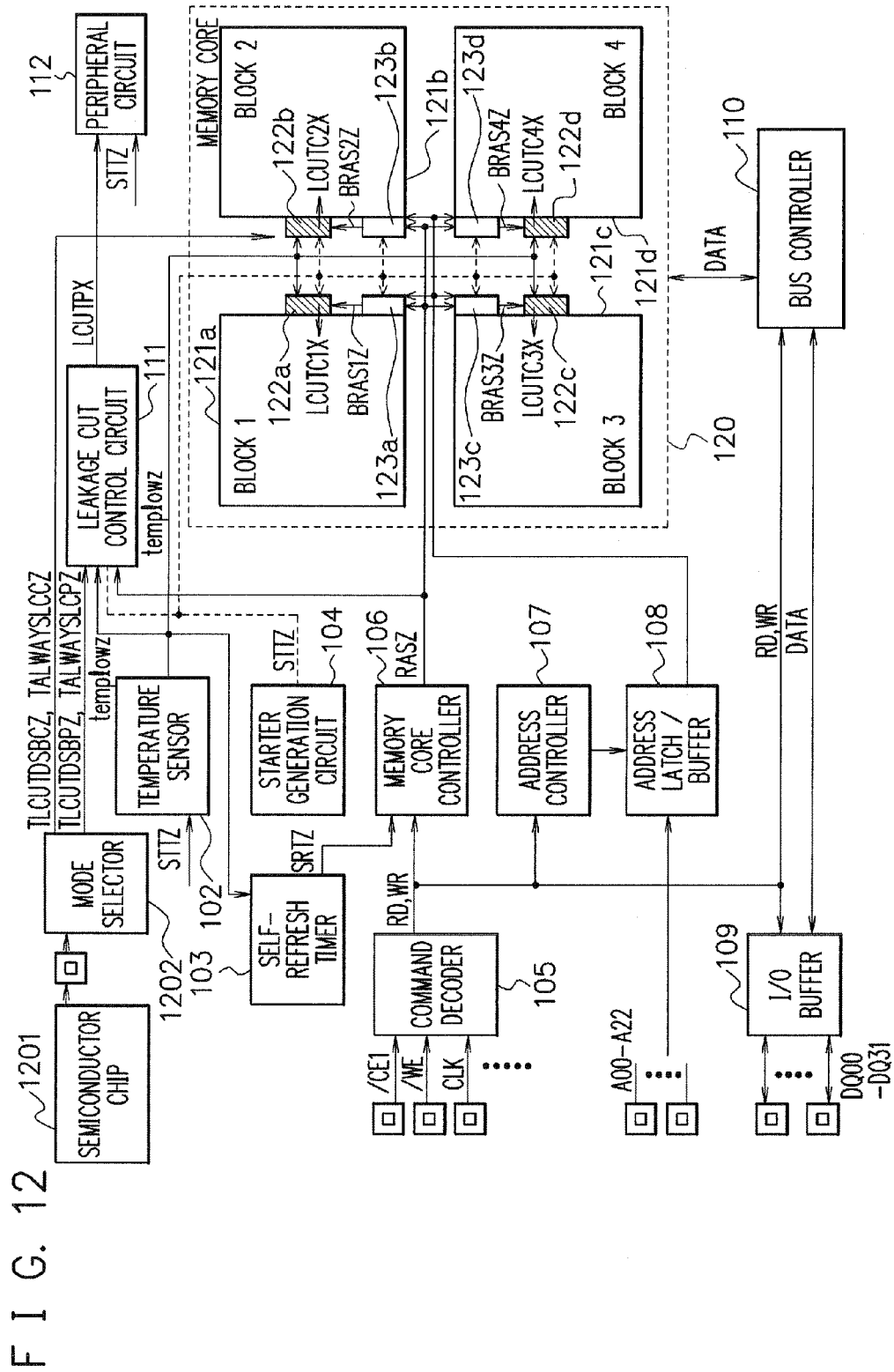
FIG. 12 is a block diagram illustrating a configuration example of a semiconductor memory device according to a second embodiment.

FIG. 12 is a block diagram illustrating a configuration example of a semiconductor memory device according to a second embodiment. This embodiment (FIG. 12) is structured such that in place of the fuse circuit 101 of the first embodiment (FIG. 1), a semiconductor chip 1201 and a mode selector 1202 are provided. Hereinafter, what makes this embodiment different from the first embodiment is described. The semiconductor chip 1201 is, for example, a CPU and outputs a mode signal to the mode selector 1202 from an external part via an external terminal of the semiconductor memory device. The mode selector 1202 outputs mode signals TLCUTDSBPZ, TALWAYSLCPZ, TLCUTDSBCZ, TALWAYSLCCZ according to the mode signal from the semiconductor chip 1201.

As described above, in the first embodiment, the mode of the leakage cut control is designated by the fuse circuit 101 mounted in the semiconductor memory device, but this embodiment is different in that the mode signal is input from the separate semiconductor chip 1201 such as the CPU, or the mode signal is input by bonding, and according to the mode signal, the mode of the leakage cut control can be changed. This makes it possible to change the mode according to the purpose of use, even in a process after a chip of the semiconductor memory device is tested and a fuse blowing process is performed. Further, when a time zone when the chip of the semiconductor memory device does not operate continues, dynamic change as a system is possible such as changing the mode so that the leakage cut control is performed even at 60° C. or lower.

Third Embodiment

Figure 13:
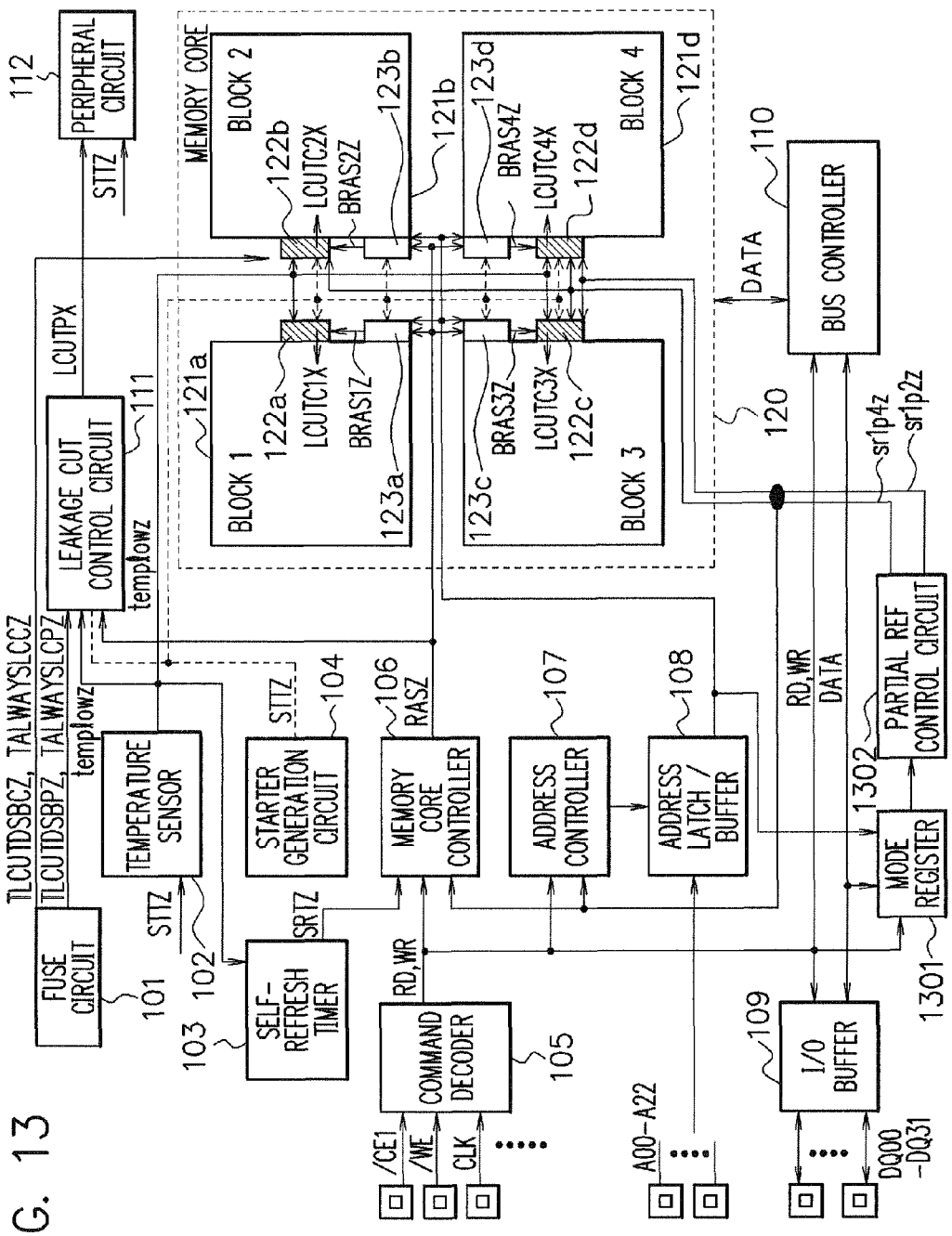
FIG. 13 is a block diagram illustrating a configuration example of a semiconductor memory device according to a third embodiment.

FIG. 13 is a block diagram illustrating a configuration example of a semiconductor memory device according to a third embodiment. This embodiment (FIG. 13) is structured such that a mode register 1301 and a partial refresh control circuit 1302 are added to the first embodiment (FIG. 1). Hereinafter, what makes this embodiment different from the first embodiment is described. The mode register (configuration register) 1301 sets a partial refresh mode according to a command, data, and an address. The partial refresh control circuit 1302 outputs a ½ partial entry signal sr1p2z or a ¼ partial entry signal sr1p4z according to the partial refresh mode of the mode register 1301. When the ½ partial entry signal sr1p2z is output to a third leakage cut control circuit 122*c* and a fourth leakage cut control circuit 122*d*, a third memory cell block 121*c* and a fourth memory cell block 121*d* do not perform a refresh operation but only a first memory cell block 121*a* and a second memory cell block 121*b* perform the refresh operation. When the ¼ partial entry signal sr1p4z is output to a second leakage cut control circuit 122*b*, the third leakage cut control circuit 122*c*, and the fourth leakage cut control circuit 122d, the second memory cell block 121b, the third memory cell block 121c, and the fourth memory cell block 121d do not perform the refresh operation and only the first memory cell block 121a performs the refresh operation.

This embodiment has the partial refresh mode in which data of some of the memory cell blocks are retained, instead of retaining data of all the memory cell blocks 121a and 121d, whereby making it possible to reduce a standby current. In this case, in the memory cell blocks whose data are not retained, the refresh operation is not performed in a standby period, and thus an AC current ascribable to leakage cut control does not increase. Therefore, when the partial refresh mode is entered, by performing the leakage cut control for the memory cell blocks whose data are not retained even when the temperature is determined as 60° C. or lower, it is possible to further reduce a standby current at 60° C. or lower. That is, in FIG. 11, since an AC current 1102 is not generated, a standby current 1107 can be reduced to a standby current 1101.

In this embodiment, the ½ partial entry signal sr1p2z being the output signal of the partial refresh control circuit 1302 is input to the leakage cut control circuits 122c, 122d of the third and fourth memory cell blocks 121c, 121d, and the ¼ partial entry signal sr1p4z is input to the leakage cut control circuits 122b to 122d of the second to fourth memory cell blocks 121b to 121d. According to the mode of the partial refresh, the leakage cut control is performed even at 60° C. or lower when the refresh request is not input to the memory cell block.

Figure 14:
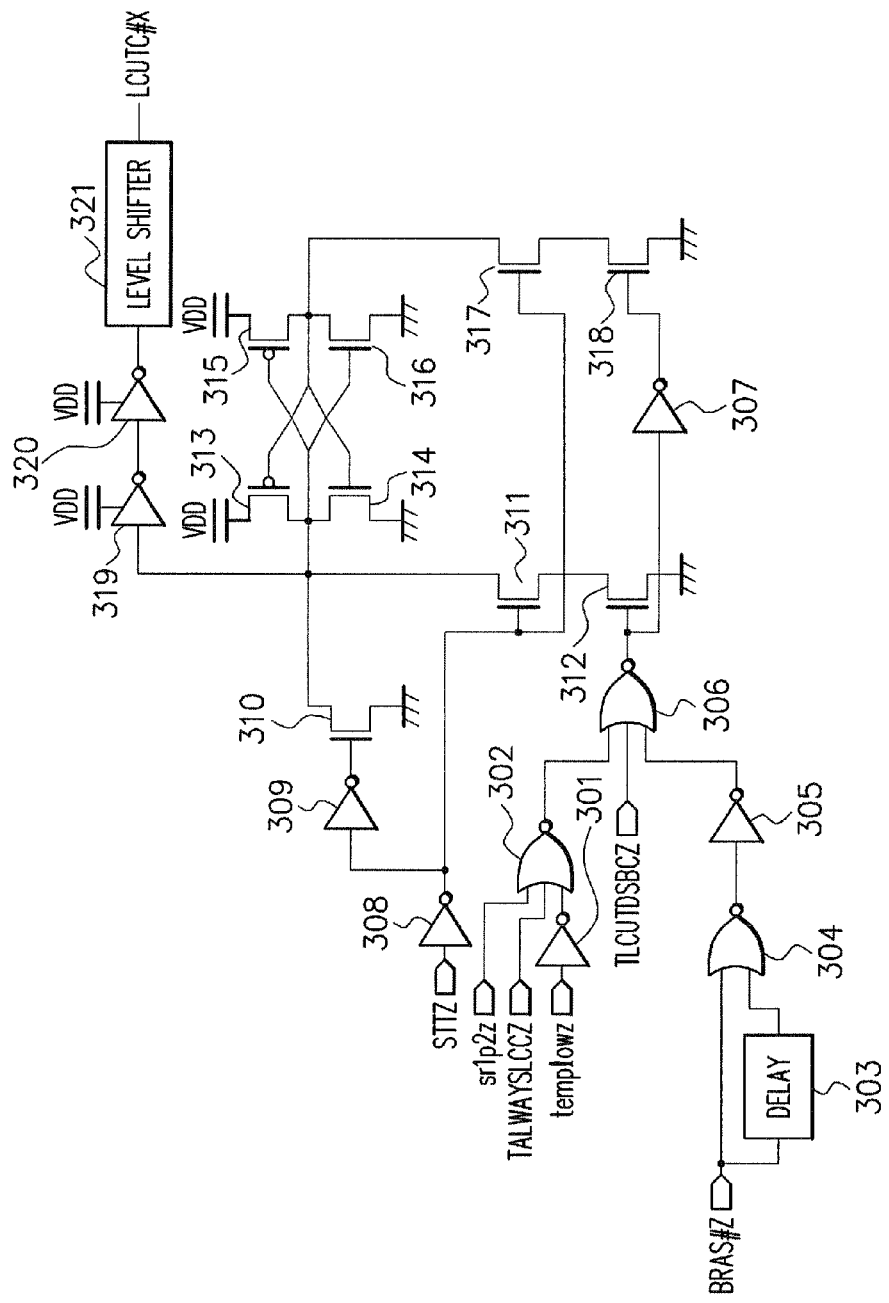
FIG. 14 is a circuit diagram illustrating a configuration example of a leakage cut control circuit in FIG. 13.

FIG. 14 is a circuit diagram illustrating a configuration example of each of the leakage cut control circuits 122c and 122d in FIG. 13. A case of the ½ partial entry signal sr1p2z is described as an example, but the operation is the same as that in a case of the ¼ partial entry signal sr1p4z. Further, the configuration of the leakage cut control circuit 122b is also the same. In FIG. 14, the ½ partial entry signal sr1p2z is added to FIG. 3. Hereinafter, what makes FIG. 14 different from FIG. 3 is described. A negative-OR circuit 302 outputs a negative-OR signal of the ½ partial entry signal sr1p2z, a mode signal TALWAYSLCCZ, and an output signal of an inverter 301. When the ½ partial entry signal sr1p2z turns to high level, a leakage cut control signal LCUTC#X is output in response to a block control signal BRAS#Z irrespective of a temperature signal templowz.

As described above, when the ½ partial entry signal sr1p2z is at high level, the leakage cut control is performed irrespective of the temperature signal templowz. In the leakage cut control circuits 122b to 122d for the second to fourth memory cell blocks 121b to 121d, the ¼ partial entry signal sr1p4z is further input, and when either ½ partial or ¼ partial is entered, the leakage cut control is performed irrespective of the temperature signal templowz.

Figure 15:
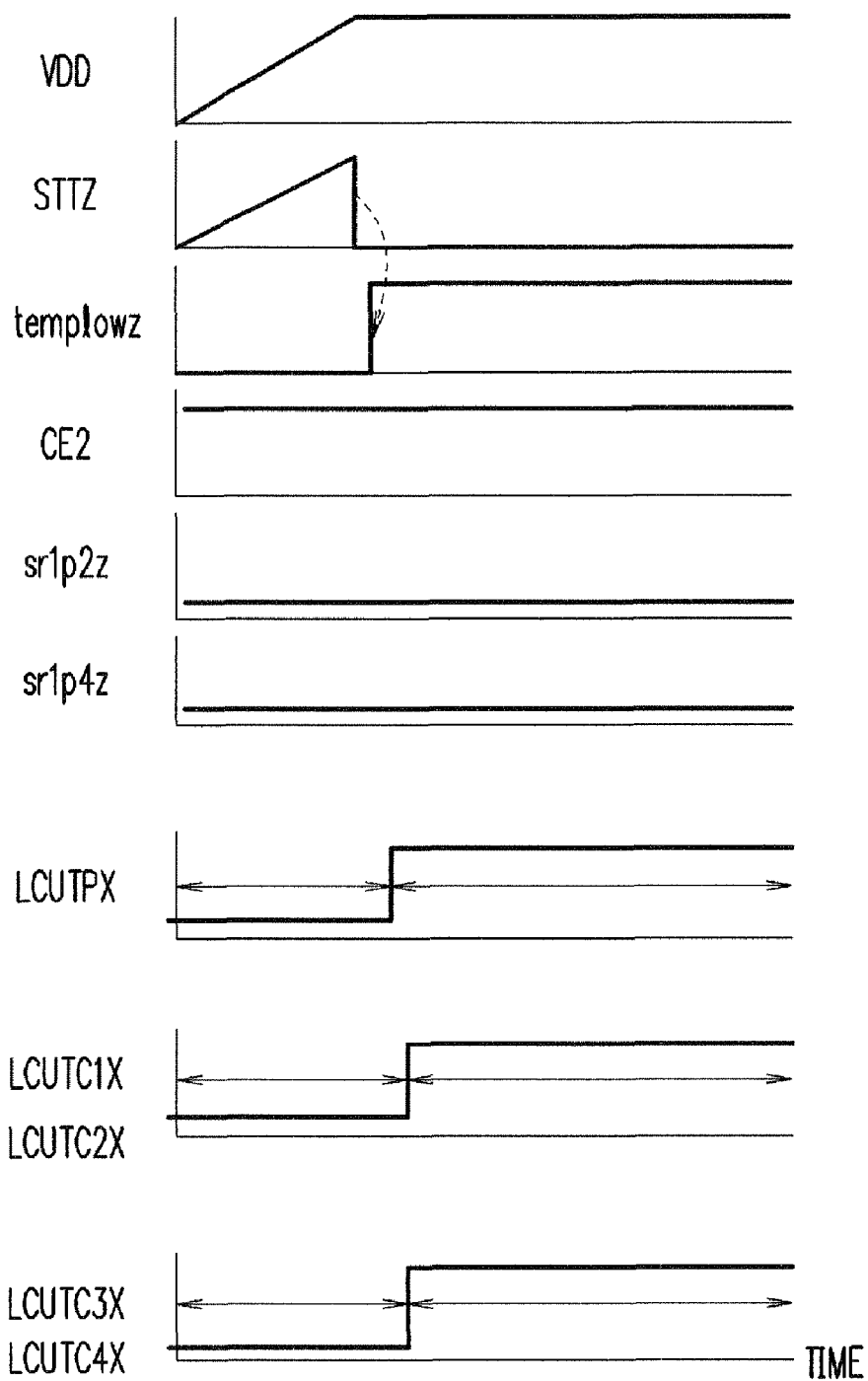
FIG. 15 is a timing chart when a partial entry signal is at low level at a temperature of 60° C. or lower.

FIG. 15 is a timing chart when the partial entry signals sr1p2z and sr1p4z are at low level at a temperature of 60° C. or lower. A case of the ½ partial is given as an example as a representative of the partial refresh mode. When the partial refresh is not entered, the ½ partial entry signal sr1p2z turns to low level, and as in the first embodiment, at the startup time, the leakage cut control signals LCUTPX, LCUTC#X are set to low level, and after a starter signal STTZ is reset to low level after the startup, the leakage cut control signals LCUTPX, LCUTC#X are constantly set to high level.

Figure 16:
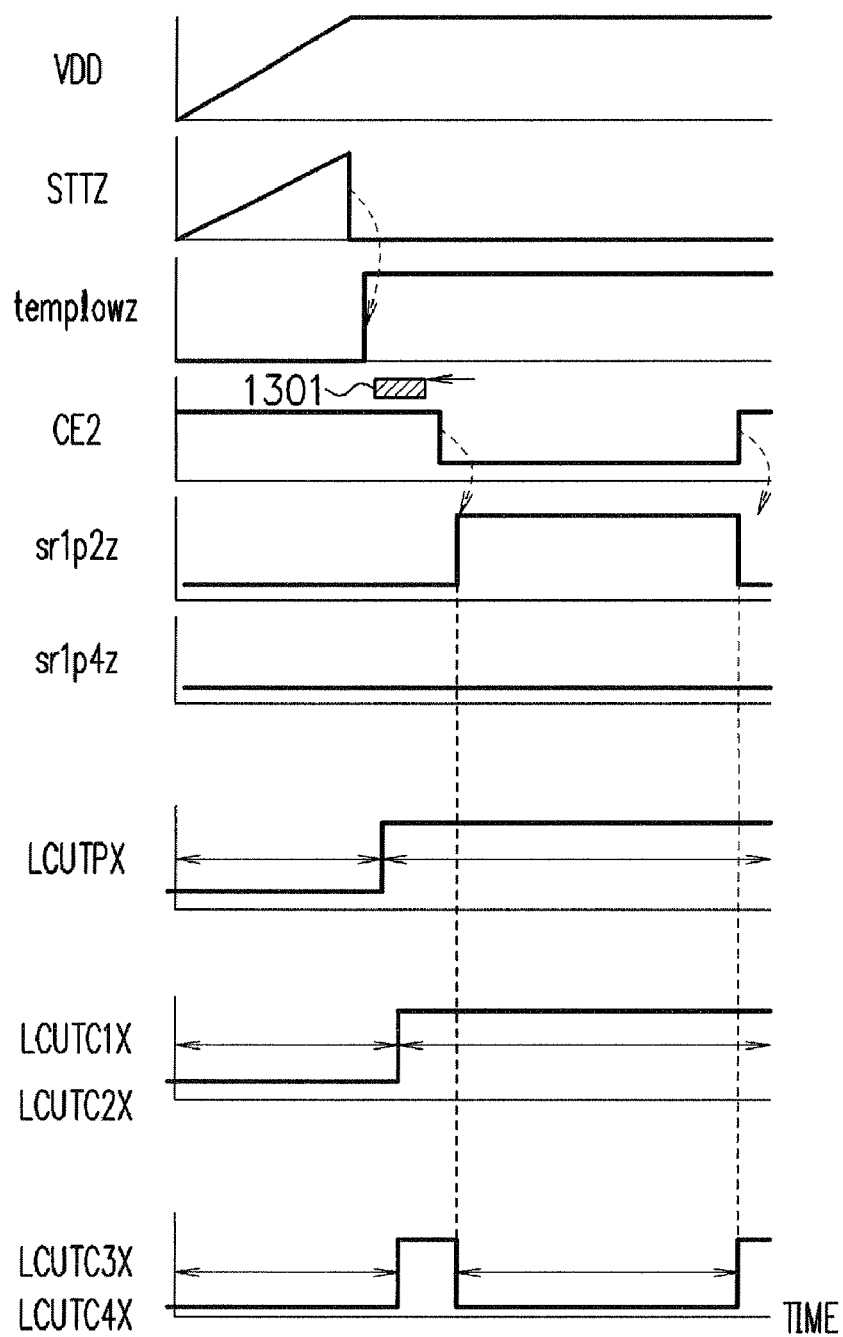
FIG. 16 is a timing chart when the partial entry signal is at high level at a temperature of 60° C. or lower.

FIG. 16 is a timing chart when the partial entry signal sr1p2z is at high level and sr1p4z is at low level at a temperature of 60° C. or lower. In order to enter the ½ partial mode, when the starter signal STTZ is reset to low level after the startup, the leakage cut control signals LCUTPX, LCUTC#X are constantly set to high level as in FIG. 15. Thereafter, when a chip enable signal CE2 is set to low level after the mode register 1301 is set to the ½ partial mode, the ½ partial mode is entered. At this time, the signal sr1p2z indicating that the ½ partial is entered turns to high level, and in response to the input of the high-level signal sr1p2z to a memory core controller 106 and an address controller 107, the third memory cell block 121c and the fourth memory cell block 121d, out of the four memory cell blocks 121a to 121d of a memory core 120, do not perform the refresh. Further, the third memory cell block 121c and the fourth memory cell block 121d are changed from a state without the leakage cut control (a leakage cut transistor 520 is constantly on) to a state with the leakage cut control. That is, the leakage cut control signals LCUTC3X, LCUTC4X turn to low level, and the leakage cut control signals LCUTC1X, LCUTC2X turn to high level. This can reduce an off leakage current at 60° C. or lower in the third and fourth memory cell blocks 121c, 121d.

Figure 17:
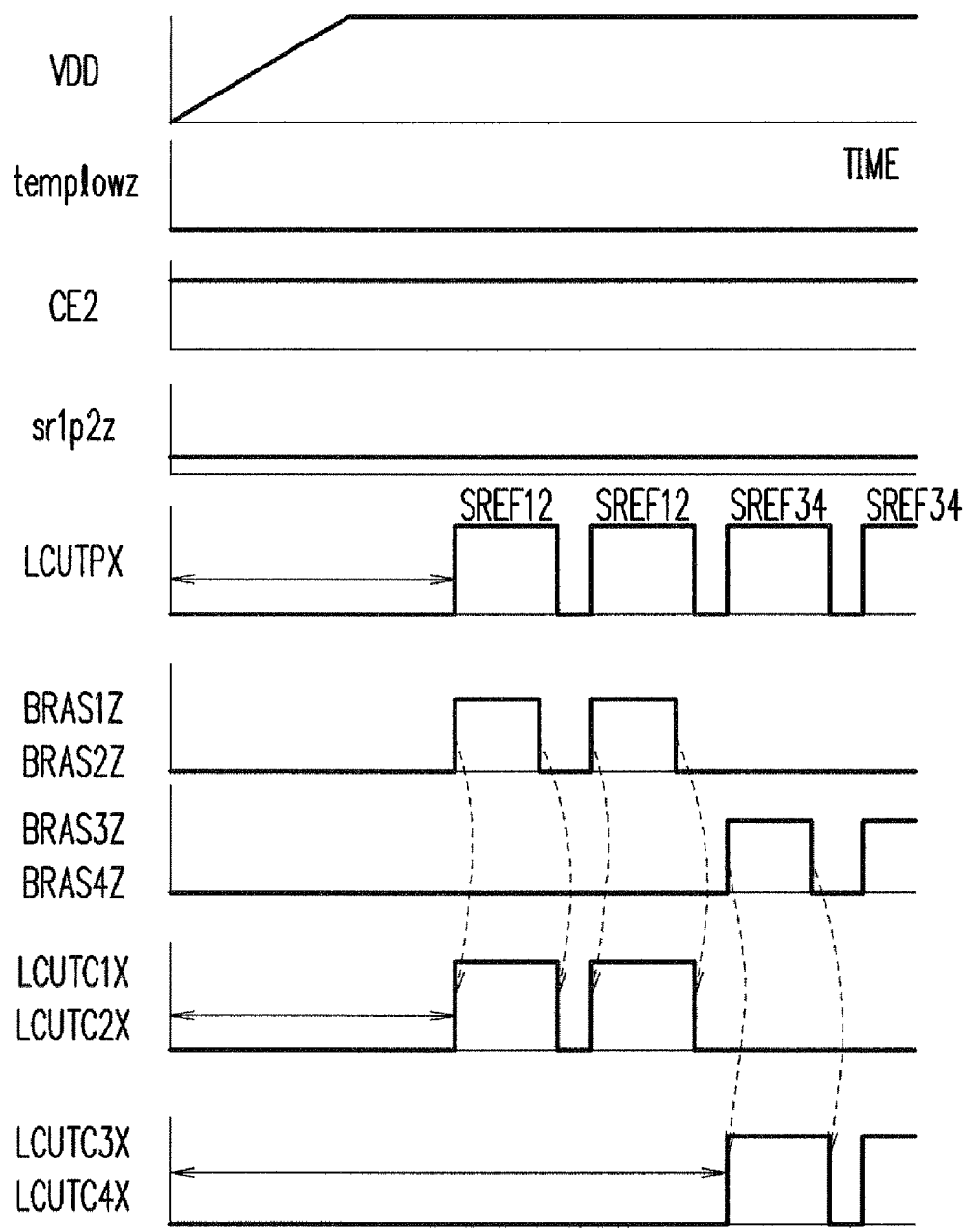
FIG. 17 is a timing chart when the partial entry signal is at low level at a temperature higher than 60° C.
Figure 18:
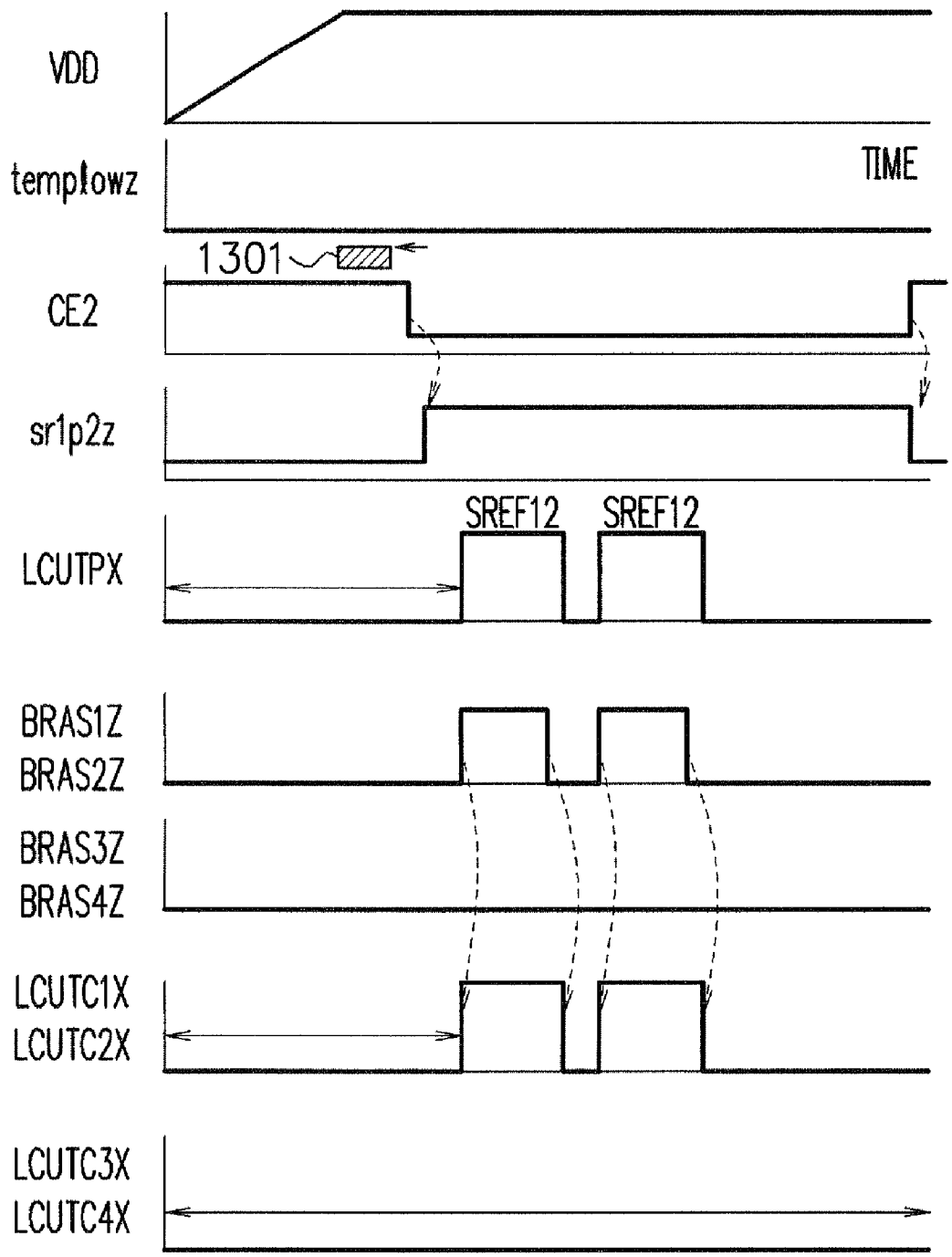
FIG. 18 is a timing chart when the partial entry signal is at high level at a temperature higher than 60° C.

FIG. 17 is a timing chart when the partial entry signal sr1p2z is at low level at a temperature higher than 60° C. FIG. 18 is a timing chart when the partial entry signal sr1p2z is at high level at a temperature higher than 60° C. At high temperatures, the leakage cut control is performed in the memory cell blocks in non-operation, as in the first embodiment, and therefore, the leakage cut control of the memory cell blocks does not change depending on whether the partial refresh mode is entered or not.

In FIG. 17, according to a refresh request signal SREF12, the block control signals BRAS1Z, BRAS2Z turn to high level and the leakage cut control signals LCUTPX, LCUTC1X, LCUTC2X turn to high level. Further, according to a refresh request signal SREF34, the block control signals BRAS3Z, BRAS4Z turn to high level and the leakage cut control signals CUTPX, LCUTC3X, LCUTC4X turn to high level.

In FIG. 18, since the ½ partial mode is entered, the refresh request SREF34 of the third and fourth memory cell blocks 121c, 121d is not generated.

Incidentally, as the mode of the partial refresh, not only the ½ partial but also ¼ partial, ⅛ partial, and so on can be performed. In the case of the ¼ partial, data of only the first memory cell block 121a is retained, and therefore, the operation is changed so that the leakage cut control is performed in the second to fourth memory cell blocks 121b to 121d at 60° C. or lower. These are the same as the ½ partial and therefore details thereof are omitted.

Fourth Embodiment

Figure 19:
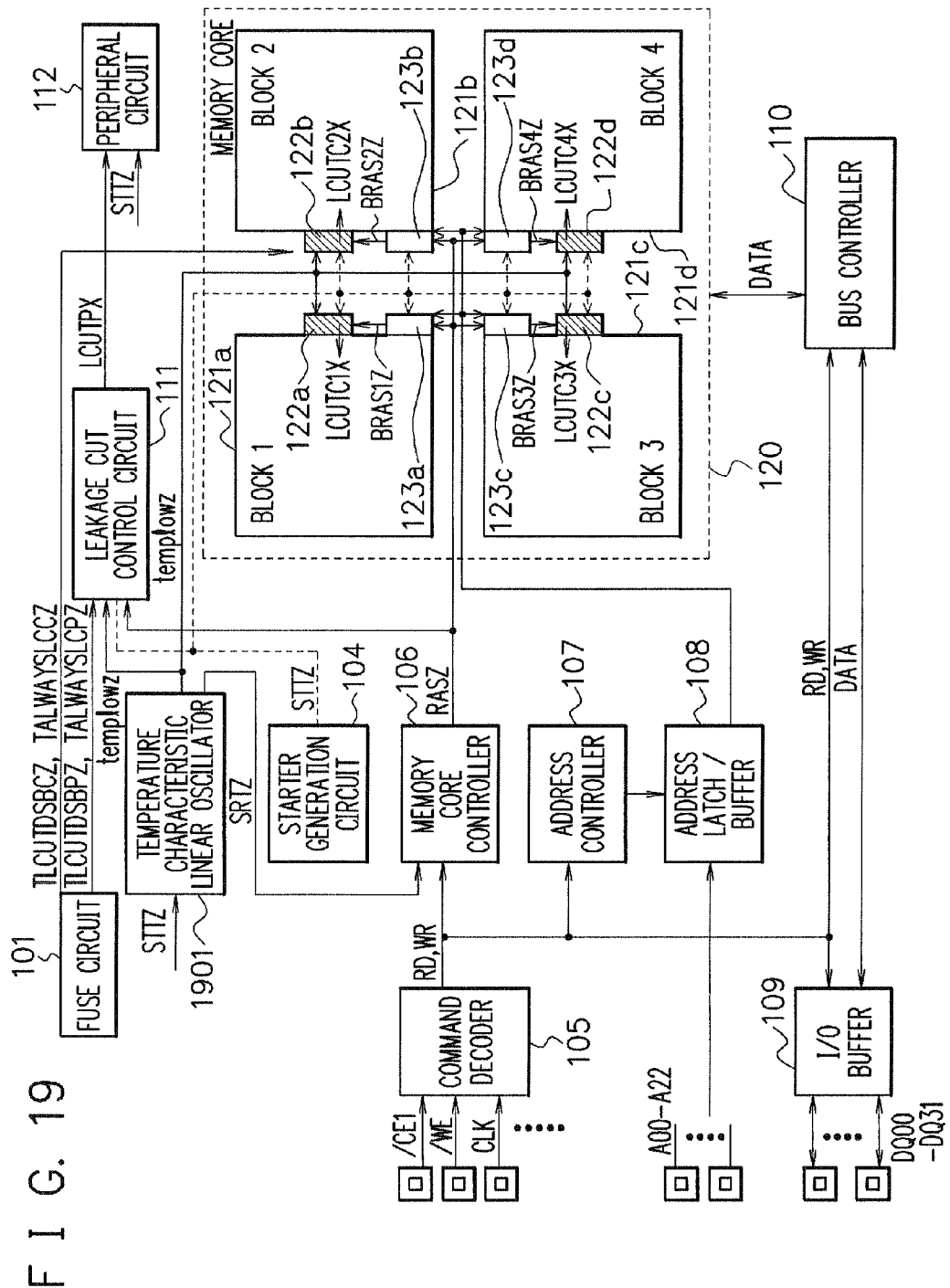
FIG. 19 is a block diagram illustrating a configuration example of a semiconductor memory device according to a fourth embodiment.

FIG. 19 is a block diagram illustrating a configuration example of a semiconductor memory device according to a fourth embodiment. This embodiment (FIG. 19) is structured such that a temperature characteristic linear oscillator 1901 is provided in place of the temperature sensor 102 and the self-refresh timer 103 of the first embodiment (FIG. 1). Hereinafter, what make this embodiment different from the first embodiment is described. The temperature characteristic linear oscillator 1901 has the functions of the temperature sensor 102 and the self-refresh timer 103 and outputs a temperature signal templowz and a refresh period signal SRTZ.

Figure 20:
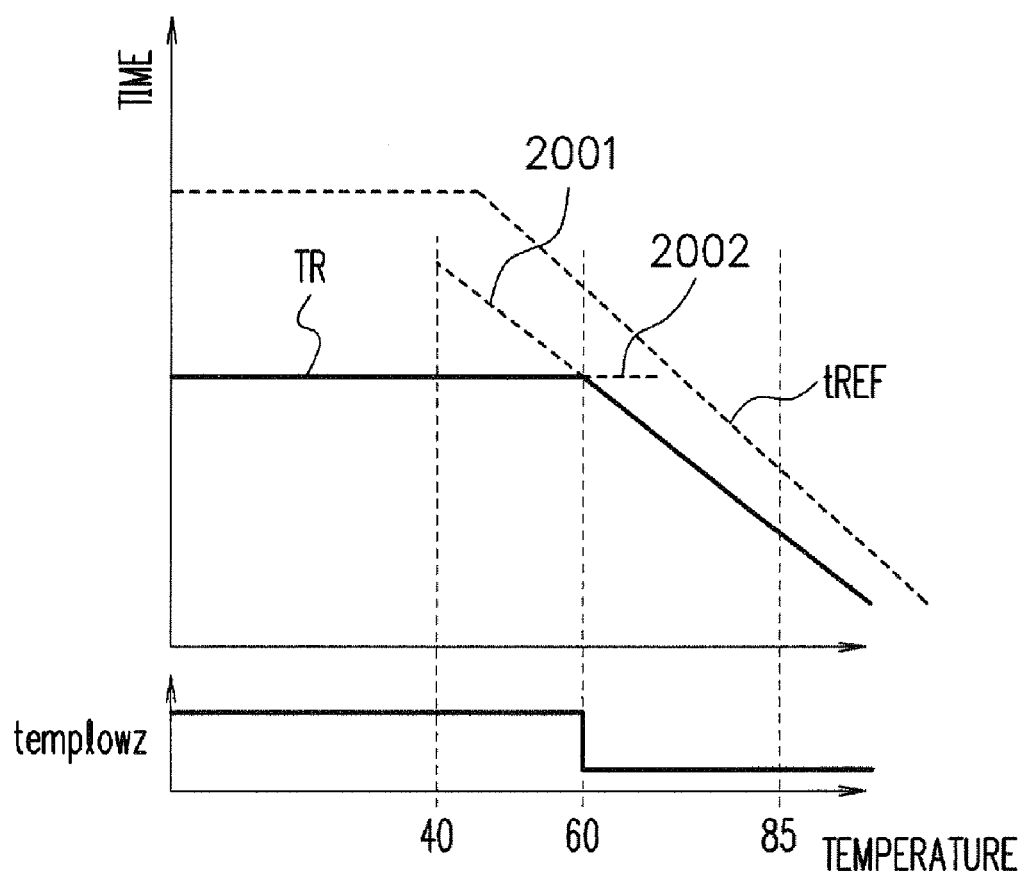
FIG. 20 is a chart illustrating a characteristic of a linear oscillator.
Figure 21:
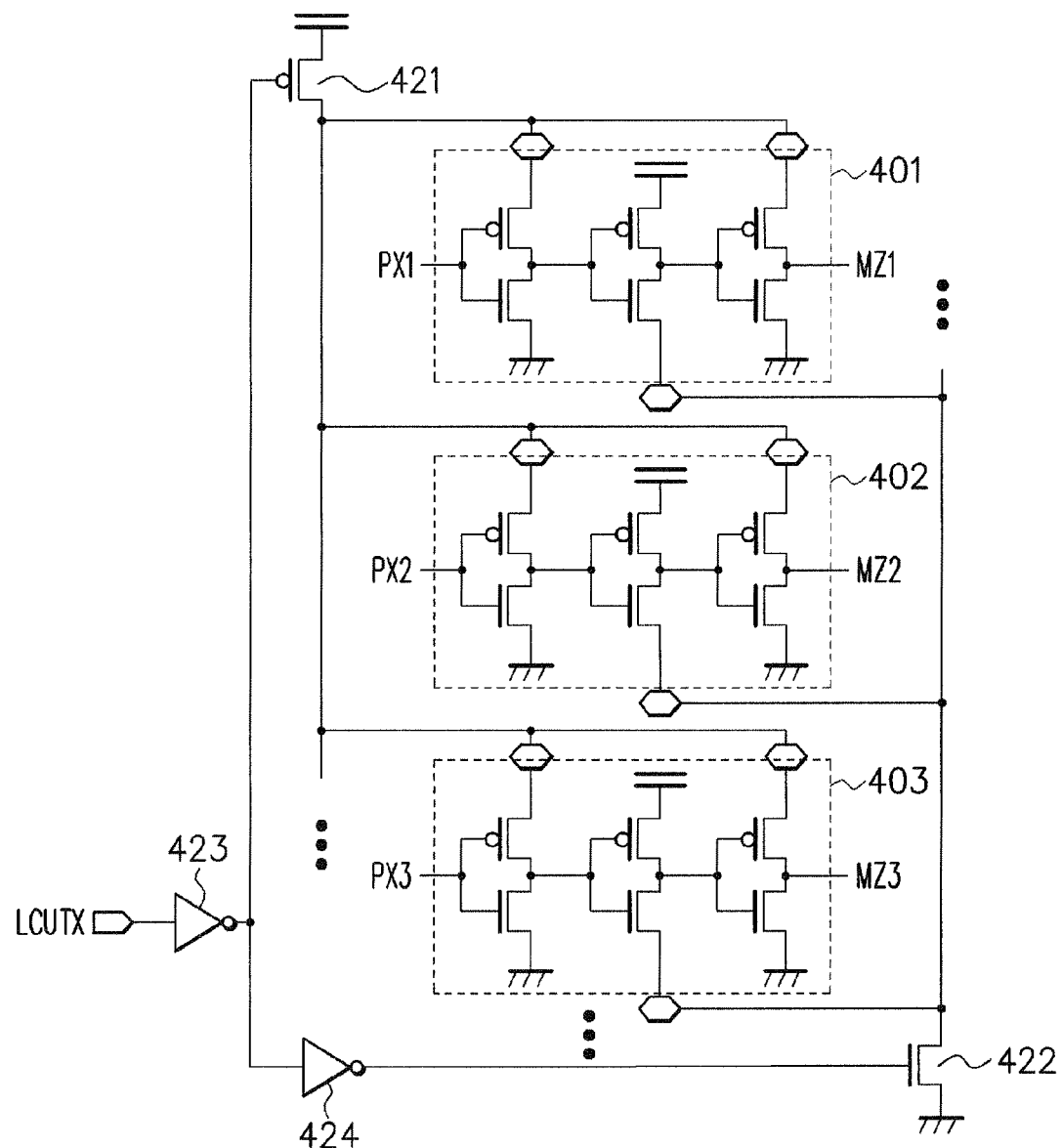
FIG. 21 is a circuit diagram of a semiconductor device.

FIG. 20 is a chart illustrating a characteristic of the linear oscillator 1901. A refresh period TR is a period of the refresh period signal SRTZ. As in the first embodiment, the temperature signal templowz turns to high level when the temperature is 60° C. or lower and turns to low level when the temperature is higher than 60° C.

A data retention time tREF is not completely linear to the temperature but how it becomes longer is saturated at a predetermined temperature or lower similarly to that in FIG. 22. Therefore, the gradient of a temperature-dependent change of the refresh period TR is also made small when the temperature is equal to the predetermined temperature or lower. As a method for realizing this, a constant current source generating two kinds of constant currents is provided, and the refresh period signal SRTZ is output in which a smaller characteristic out of characteristics 2001 and 2002 of the two kinds of the constant currents is set as the refresh period TR. As a result, the period output at the predetermined temperature changes among the two, and at an instant of the change, level of the temperature signal templowz is changed. By inputting the temperature signal templowz to leakage cut control circuits 111, 122a to 122d, it is possible to obtain the effect of reducing a standby current both at 60° C. or lower and at temperatures higher than 60° C. as in the first embodiment also when the linear oscillator 1901 is used.

Figure 25:
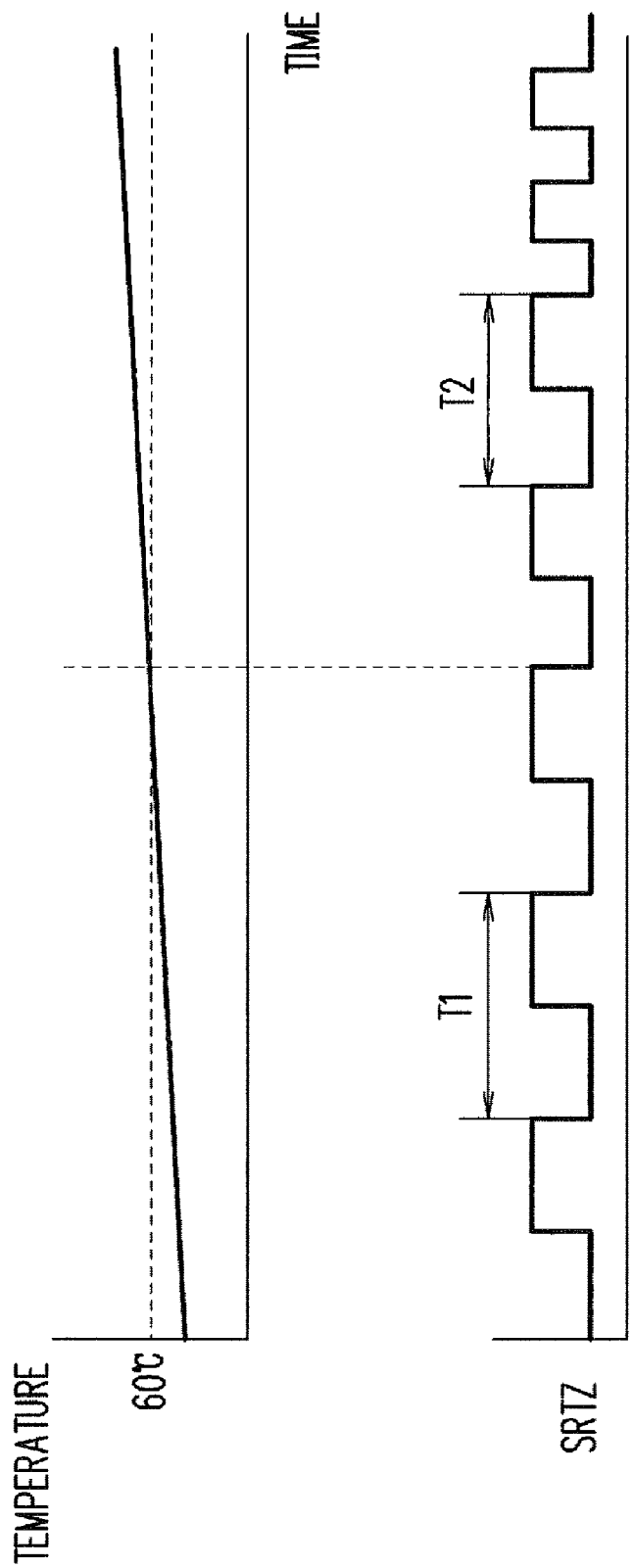
FIG. 25 is a chart illustrating a temperature characteristic of the refresh period signal.

FIG. 25 is a chart illustrating a temperature characteristic of the refresh period signal SRTZ. The refresh period signal SRTZ continuously changes the refresh period TR depending on the temperature as illustrated in FIG. 20. When the temperature is 60° C. or lower, a period T1 of the refresh period signal SRTZ is constant. At temperatures higher than 60° C., a period T2 of the refresh period signal SRTZ continuously becomes shorter as the temperature becomes higher.

As described above, according to the first to fourth embodiments, the temperature sensor is used and when the temperature is higher than the predetermined temperature (60° C.), the leakage cut control is performed, and when the temperature is equal to the predetermined temperature (60° C.) or lower, the leakage cut control is not performed and the leakage cut transistors 421, 422, 520 are constantly kept on and thus the AC current 1102 ascribable to the leakage cut control is eliminated, whereby it is possible to reduce the total standby current both when the temperature is higher than the predetermined temperature and when the temperature is equal to or lower than. At this time, by performing the leakage cut control irrespective of the temperature at the startup time, it is possible to avoid poor startup. Further, in the partial refresh mode, even when the temperature is equal to lower than the predetermined temperature, the leakage cut control is performed for the memory cell block not performing the refresh, which can further reduce the total standby current when the temperature is equal to or lower than the predetermined temperature or lower. Further, when the linear oscillator 1901 is provided in place of the temperature sensor 102 as the temperature detecting element, it is also possible to obtain the same effect.

The temperature detecting element 102 or 1901 detects the temperature. The inner circuit is, for example, the peripheral circuit 112 or the memory cell blocks 121a to 121d and operates when supplied with the power supply voltage from the power supply line. The leakage cut transistors 421, 422, 520 are switches connected between the power supply line (power supply line of the power supply voltage or the reference potential) and the inner circuits 112, 121a to 121d. The leakage cut control circuits 111, 122a to 122d perform the control in which, in the case where the temperature detected by the temperature detecting element 102 or 1901 is higher than the threshold value (for example, 60° C.), the switches 421, 422, 520 are turned on when the inner circuits 112, 121a to 121d are in operation, and the switches 421, 422, 520 are turned off when the inner circuits 112, 121a to 121d are in non-operation, and in the case where the temperature detected by the temperature detecting element 102 or 109 is lower than the threshold value, the switches 421, 422, 520 are turned on when the inner circuits 112, 121a to 121d are in operation and in non-operation.

The inner circuits 112, 121a to 121d operate according to the operation signal RASZ or BRAS#Z. The leakage cut control circuits 111, 122a to 122d determine whether the inner circuits 112, 121a to 121d are in operation or in non-operation according to the operation signal RASZ or BRAS#Z.

The leakage cut control circuits 111, 122a to 122d perform the control according to the starter signal STTZ in a manner that the switches 421, 422, 520 are turned off at the startup time irrespective of the temperature detected by the temperature detecting element 102 or 1901.

The mode setting circuit is, for example, the fuse circuit 101, the mode selector 1201, or the like and sets the first mode, the second mode, or the third mode. For example, the mode setting circuit is the fuse circuit (memory) 101 storing the first mode, the second mode, or the third mode, or is the mode selector 1202 setting the first mode, the second mode, or the third mode according to an external signal.

Under the setting of the first mode, in the case where the temperature detected by the temperature detecting element is higher than the threshold value, the leakage cut control circuits 111, 122a to 122d turn on the switches when the inner circuits are in operation and turn off the switches when the inner circuits are in non-operation, and in the case where the temperature detected by the temperature detecting element is lower than the threshold value, the leakage cut control circuits 111, 122a to 122d turn on the switches when the inner circuits are in operation and in non-operation.

Further, under the setting of the second mode, the leakage cut control circuits 111, 122a to 122d perform the control in which the switches are turned on when the inner circuits are in operation and the switches are turned off when the inner circuits are in non-operation, irrespective of the temperature detected by the temperature detecting element.

Further, under the setting of the third mode, the leakage cut control circuits 111, 122a to 122d perform the control in which the switches are turned on when the inner circuits are in operation and in non-operation, irrespective of the temperature detected by the temperature detecting element.

The memory cell blocks 121a to 121d have the memory cells storing data. The inner circuit is the peripheral circuit 112 or the word decoder in FIG. 5 and is a circuit controlling the operation of the memory cells. In the memory cells, the refresh operation for retaining the data is performed. Further, the memory cells are divided into the plural blocks 121a to 121d.

The inner circuit is, for example, the word decoders in the memory cell blocks 121a to 121d and has a plurality of inner circuits controlling the operations of the respective blocks of the memory cells individually. The switch is provided for each of the plural inner circuits. The leakage cut control circuit has the plural control circuits 122a to 122d controlling the switches of the plural inner circuits. Further, the inner circuit is the peripheral circuit 112 commonly controlling the operations of the plural blocks of the memory cells.

In the third embodiment, the refresh operation is performed on per block basis in the memory cells. The leakage cut control circuits 122a to 122d turn off the switches when the inner circuit is in non-operation, irrespective of the temperature detected by the temperature detecting element, upon receiving the refresh inhibiting signals sr1p2z, sr14z for inhibiting the refresh operation of the corresponding block of the memory cells.

In the memory cells, the refresh operation is performed with the period TR that is set according to the temperature detected by the temperature detecting element. In the fourth embodiment, as illustrated in FIG. 20, the period TR of the refresh operation continuously changes depending on the temperature detected by the temperature detecting element, and the threshold value is a temperature value (for example, 60° C.) corresponding to a change point of the gradient of the period TR of the refresh operation with respect to the detected temperature.

It should be noted that all of the above-described embodiments merely give the concrete examples for carrying out the present invention, and the technical scope of the present invention should not be construed in a restrictive manner by these embodiments. That is, the present invention can be carried out in various forms without departing from the technical spirit thereof or the main features thereof.

It is possible to reduce a standby current both at high temperatures and at room temperatures by controlling a switch according to temperature.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a temperature detecting element detecting temperature;
   an inner circuit operating when supplied with a power supply voltage from a power supply line;
   a switch connected between the power supply line and the inner circuit; and
   a control circuit performing control in which, in a case where the temperature detected by the temperature detecting element is higher than a threshold value, the switch is turned on when the inner circuit is in operation and the switch is turned off when the inner circuit is in non-operation, and in a case where the temperature detected by the temperature detecting element is lower than the threshold value, the switch is turned on when the inner circuit is in operation and in non-operation.

2. The semiconductor device according to claim 1, wherein the control circuit performs control in which the switch is turned off at a startup time irrespective of the temperature detected by the temperature detecting element.

3. The semiconductor device according to claim 1, further comprising
   a mode setting circuit setting a first mode or a second mode, wherein
   the control circuit performs control in which: under the setting of the first mode, in the case where the temperature detected by the temperature detecting element is higher than the threshold value, the switch is turned on when the inner circuit is in operation and the switch is turned off when the inner circuit is in non-operation, and in the case where the temperature detected by the temperature detecting element is lower than the threshold value, the switch is turned on when the inner circuit in operation and in non-operation; and under the setting of the second mode, the switch is turned on when the inner circuit is in operation and the switch is turned off when the inner circuit is in non-operation, irrespective of the temperature detected by the temperature detecting element.

4. The semiconductor device according to claim 3, wherein the mode setting circuit is a memory storing the first mode or the second mode.

5. The semiconductor device according to claim 3, wherein the mode setting circuit sets the first mode or the second mode according to an external signal.

6. The semiconductor device according to claim 1, further comprising
   a mode setting circuit setting a first mode or a second mode, wherein
   the control circuit performs control in which: under the setting of the first mode, in the case where the temperature detected by the temperature detecting element is higher than the threshold value, the switch is turned on when the inner circuit is in operation and the switch is turned off when the inner circuit is in non-operation, and in the case where the temperature detected by the temperature detecting element is lower than the threshold value, the switch is turned on when the inner circuit is in operation and in non-operation; and under the setting of the second mode, the switch is turned on when the inner circuit is in operation and in non-operation irrespective of the temperature detected by the temperature detecting element.

7. The semiconductor device according to claim 6, wherein the mode setting circuit is a memory storing the first mode or the second mode.

8. The semiconductor device according to claim 6, wherein the mode setting circuit sets the first mode or the second mode according to an external signal.

9. The semiconductor device according to claim 1, further comprising
   a mode setting circuit setting a first mode, a second mode, or a third mode, wherein
   the control circuit performs control in which: under the setting of the first mode, in the case where the temperature detected by the temperature detecting element is higher than the threshold value, the switch is turned on when the inner circuit is in operation and the switch is turned off when the inner circuit is in non-operation, and in the case where the temperature detected by the temperature detecting element is lower than the threshold value, the switch is turned on when the inner circuit is in operation and in non-operation; under the setting of the second mode, the switch is turned on when the inner circuit is in operation and the switch is turned off when the inner circuit is in non-operation, irrespective of the temperature detected by the temperature detecting element; and under the setting of the third mode, the switch is turned on when the inner circuit is in operation and in non-operation irrespective of the temperature detected by the temperature detecting element.

10. The semiconductor device according to claim 1, further comprising
    memory cells storing data, wherein
    the inner circuit is a circuit controlling an operation of the memory cells.

11. The semiconductor device according to claim 10, wherein in the memory cells, a refresh operation for retaining the data is performed.

12. The semiconductor device according to claim 11, wherein the memory cells are divided into a plurality of blocks.

13. The semiconductor device according to claim 12, wherein:
- the inner circuit comprises a plurality of inner circuits controlling the operations of the respective blocks of the memory cells individually;
- the switch is provided for each of the plural inner circuits; and
- the control circuit has a plurality of control circuits controlling the switches of the plural inner circuits.

14. The semiconductor device according to claim 13, wherein:
- in the memory cells, the refresh operation is performed on per block basis; and
- the control circuits each turn off the switch when the inner circuit is in non-operation irrespective of the temperature detected by the temperature detecting element, upon receiving a refresh inhibiting signal for inhibiting the refresh operation of the corresponding block of the memory cells.

15. The semiconductor device according to claim 12, wherein the inner circuit is a circuit commonly controlling the operations of the plural blocks of the memory cells.

16. The semiconductor device according to claim 11, wherein in the memory cells, the refresh operation is performed with a period that is set according to the temperature detected by the temperature detecting element.

17. The semiconductor device according to claim 16, wherein:
- the period of the refresh operation continuously changes depending on the temperature detected by the temperature detecting element; and
- the threshold value is a temperature value corresponding to a change point of a gradient of the period of the refresh operation with respect to the detected temperature.

18. The semiconductor device according to claim 1, wherein:
- the inner circuit operates according to an operation signal; and
- the control circuit determines whether the inner circuit is in operation or in non-operation according to the operation signal.

19. The semiconductor device according to claim 1, wherein the switch is a transistor.

20. The semiconductor device according to claim 1, wherein the switch is connected to a power supply line of a power supply voltage or a power supply line of a reference potential.

* * * * *